US012635288B2

(12) United States Patent
Bailie et al.

(10) Patent No.: US 12,635,288 B2
(45) Date of Patent: May 19, 2026

(54) PHOTOVOLTAIC CELL ASSEMBLY WITH ULTRAVIOLET FILTERING

(71) Applicant: Tandem PV, San Jose, CA (US)

(72) Inventors: Colin David Bailie, Morgan Hill, CA (US); Chris Eberspacher, Palo Alto, CA (US); Thomas Michael Brenner, San Mateo, CA (US)

(73) Assignee: Tandem PV, San Jose, CA (US)

( * ) Notice: Subject to any disclaimer, the term of this patent is extended or adjusted under 35 U.S.C. 154(b) by 0 days.

(21) Appl. No.: 18/793,197

(22) Filed: Aug. 2, 2024

(65) Prior Publication Data

US 2026/0040727 A1 Feb. 5, 2026

(51) Int. Cl.
H10F 77/80 (2025.01)
H10F 10/172 (2025.01)
H10F 77/70 (2025.01)
H10F 71/00 (2025.01)
H10F 77/20 (2025.01)

(52) U.S. Cl.
CPC ......... H10F 77/707 (2025.01); H10F 10/172 (2025.01); H10F 77/80 (2025.01); *H10F 71/138* (2025.01); *H10F 77/251* (2025.01)

(58) Field of Classification Search
CPC ...... H10F 77/707; H10F 10/172; H10F 77/80; H10F 71/138; H10F 77/251
See application file for complete search history.

(56) References Cited

PUBLICATIONS

Al-Shujaa "Hydrothermal Deposition of UV-Absorbing Passivation Layers for Efficient and Stable Perovskite Solar Cells" Adv. Energy Sustainability Res. 2023, 4, 2200203 (Year: 2023).*

* cited by examiner

*Primary Examiner* — Angelo Trivisonno
(74) *Attorney, Agent, or Firm* — Patterson + Sheridan, LLP

(57) ABSTRACT

A photovoltaic device includes a plurality of photovoltaic cells coupled in series, the photovoltaic cells including a first contact layer disposed over a first substrate, a first charge transport layer (CTL) disposed over the first contact layer, an absorber layer disposed over the first CTL, a second CTL disposed over the absorber layer, and an ultraviolet (UV) blocking layer comprising a first layer formed on a first side of the first substrate and a second layer formed over the first layer, wherein a refractive index (RI) between the first layer and the first substrate is less than or equal to 1.3, and an RI between the second layer and the first layer is from about 0.75 and about 1.5.

14 Claims, 18 Drawing Sheets

100B

600

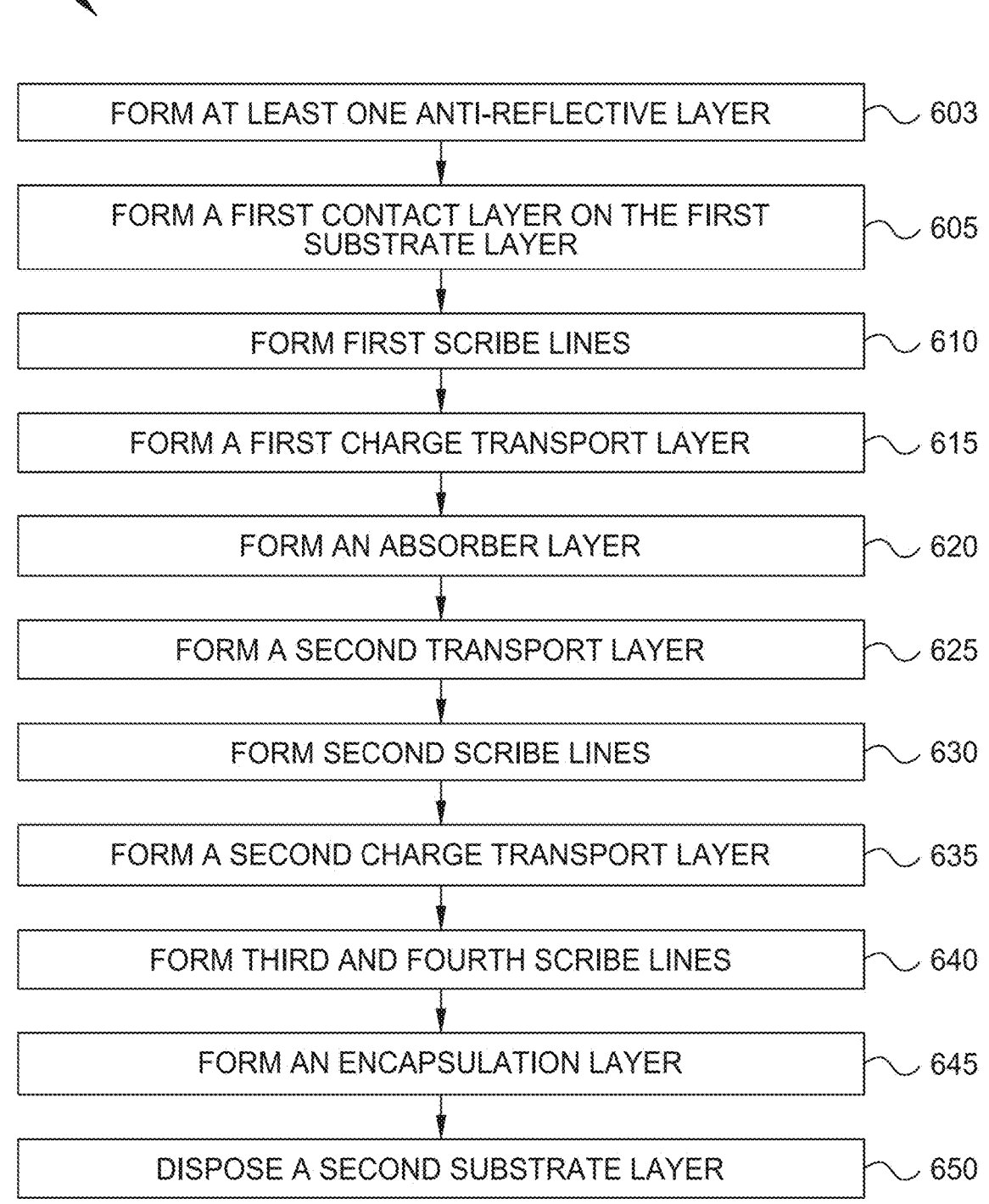

FORM AT LEAST ONE ANTI-REFLECTIVE LAYER — 603

FORM A FIRST CONTACT LAYER ON THE FIRST SUBSTRATE LAYER — 605

FORM FIRST SCRIBE LINES — 610

FORM A FIRST CHARGE TRANSPORT LAYER — 615

FORM AN ABSORBER LAYER — 620

FORM A SECOND TRANSPORT LAYER — 625

FORM SECOND SCRIBE LINES — 630

FORM A SECOND CHARGE TRANSPORT LAYER — 635

FORM THIRD AND FOURTH SCRIBE LINES — 640

FORM AN ENCAPSULATION LAYER — 645

DISPOSE A SECOND SUBSTRATE LAYER — 650

FIG. 6

700
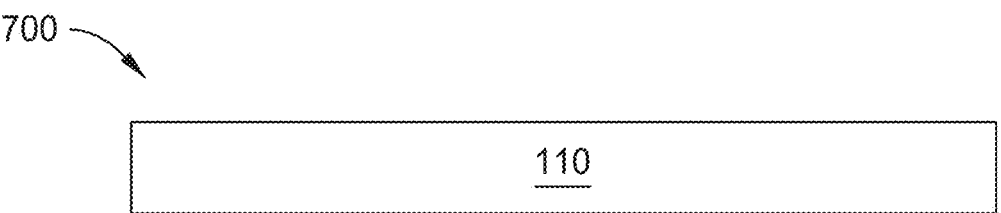
FIG. 7A
700
110B
110F
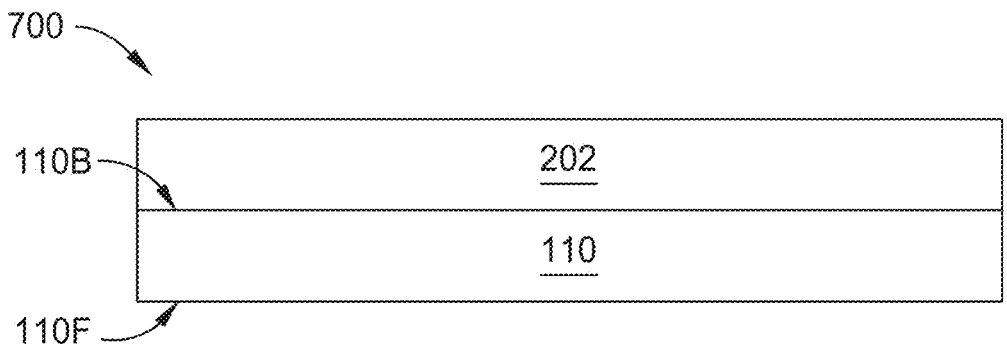
FIG. 7B
700
110B
110F
FIG. 7C

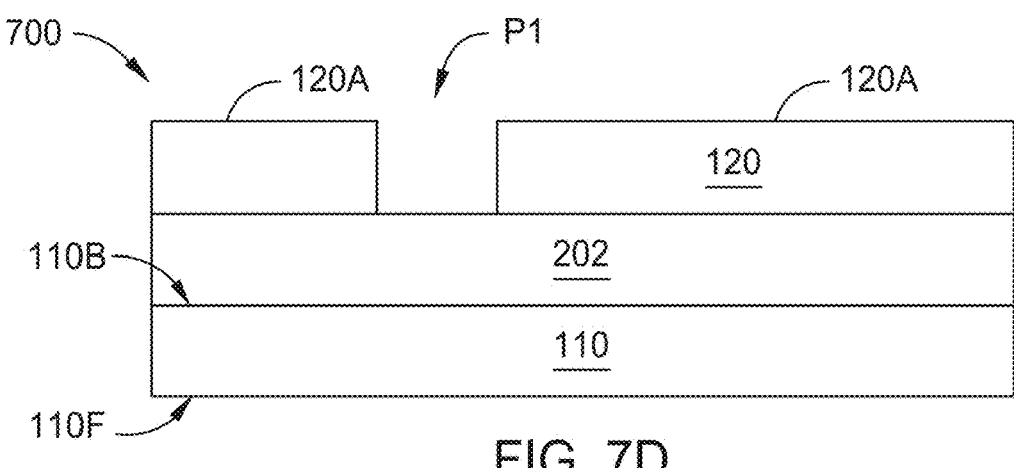
FIG. 7D
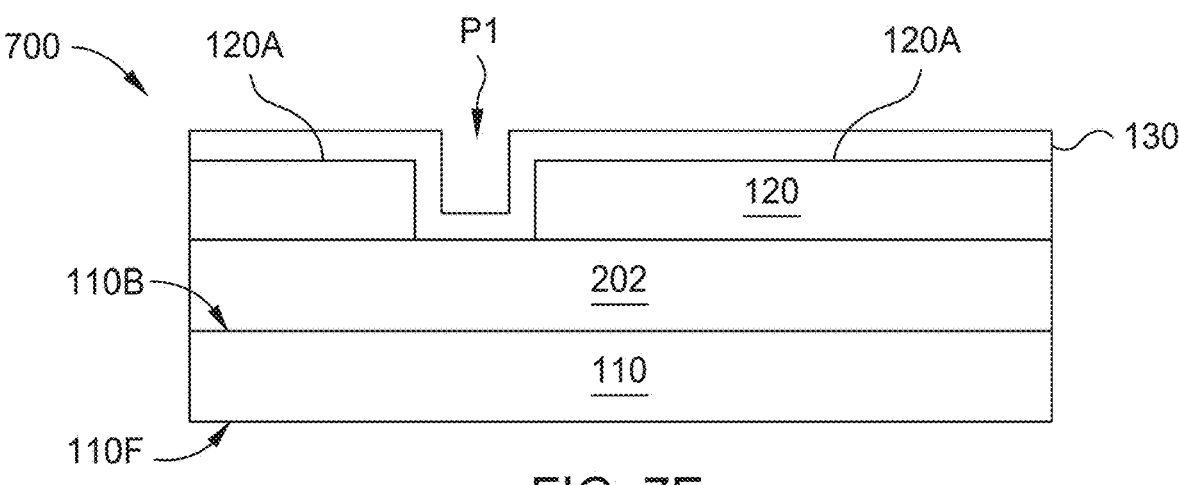
FIG. 7E
FIG. 7F

700

700

PHOTOVOLTAIC CELL ASSEMBLY WITH ULTRAVIOLET FILTERING

BACKGROUND

Field

Embodiments of the present disclosure generally relate to protecting photovoltaic (PV) cell assemblies from ultraviolet radiation damage. More specifically, embodiments described herein relate to methods for protecting stacked tandem photovoltaic cell assemblies from ultraviolet radiation damage.

Description of the Related Art

As the renewable energy resource adoption rate continues to accelerate, both industry and consumers alike, continue to push for improvements in technology, performance, and cost. A key technology in the "green revolution" is photovoltaics. As consumer adoption accelerates, the demand for greater efficiencies from solar technology continues, requiring new techniques, materials, and architectures.

Perovskite photovoltaic cells have attracted attention for being easy to construct and yielding high conversion efficiencies. When combined with a silicon photovoltaic cell as mechanically-stacked tandem module, efficiencies over 30% have been achieved in small-area cell testing thus demonstrating efficiencies far above those of traditional single-junction silicon cells. However, while these stacked perovskite-silicon photovoltaic cells have excelled in testing, commercial readiness has remained elusive due to durability issues. For example, the hole transport layer (HTL), the first layer of the perovskite cell with which incoming light interacts with, has shown to be susceptible to damage from ultraviolet (UV) radiation. Accordingly, in order to reach commercial readiness, there is currently a great need in the art for methods and materials to protect the materials disposed within a perovskite containing solar cell from UV radiation.

Therefore there is a need for solar cell device and method of forming the same that solves the problems described herein.

SUMMARY

Embodiments of the present disclosure generally relate to protecting photovoltaic cell assemblies from ultraviolet radiation damage. More specifically, embodiments described herein relate to protecting stacked tandem photovoltaic cell assemblies from ultraviolet radiation damage.

According to one or more embodiments a photovoltaic device includes a plurality of photovoltaic cells coupled in series, the photovoltaic cells including a first contact layer disposed over a first substrate, a first charge transport layer (CTL) disposed over the first contact layer, an absorber layer disposed over the first CTL, a second CTL disposed over the absorber layer, and an ultraviolet (UV) blocking layer comprising a first layer formed on a first side of the first substrate and a second layer formed over the first layer, wherein a refractive index (RI) between the first layer and the first substrate is less than or equal to 1.3, and an RI between the second layer and the first layer is from about 0.75 and about 1.5.

According to one or more embodiments, a photovoltaic device includes a plurality of photovoltaic cells coupled in series, the photovoltaic cells including a first contact layer disposed over a first substrate, a first charge transport layer (CTL) disposed over the first contact layer, an absorber layer disposed over the first CTL, a second CTL disposed over the absorber layer; and a first ultraviolet (UV) blocking layer comprising a first layer formed on a first side of the first substrate and a second layer formed over the first layer.

According to one or more embodiments, a method includes, depositing a first ultraviolet (UV) blocking layer on a first surface of a glass substrate, wherein depositing the first UV blocking layer includes depositing a first layer on the first surface of the glass substrate, wherein a refractive index (RI) difference between the first layer and the glass substrate is less than or equal to 1.3, and depositing a second layer on the first layer, wherein a refractive index (RI) difference between the second layer and the first layer is from about 0.75 and about 1.5, and depositing a contact layer on the first ultraviolet (UV) blocking layer or on a second surface of the glass substrate, wherein the contact layer comprises a transparent conductive oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 6 illustrates a method of fabricating a photovoltaic cell within the photovoltaic device according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Perovskite photovoltaic cells have attracted attention for being easy to construct and yielding high conversion efficiencies. When combined with a silicon solar cell as mechanically-stacked tandem module, efficiencies over 30% have been achieved in small-area cell testing thus demonstrating efficiencies far above those of traditional single-junction silicon cells. However, while these stacked perovskite-silicon photovoltaic cells have excelled in testing, commercial readiness has remained elusive due to durability issues. For example, the hole transport layer, the first layer of the perovskite cell with which incoming electromagnetic radiation, often referred to herein as simply "light," interacts with has shown to be susceptible to damage from exposure to ultraviolet and blue electromagnetic radiation wavelengths, such as one or more wavelengths between 300 nanometers (nm) and 450 nm. For ease of discussion and not intending to limit the scope of the disclosure provided herein the wavelengths of light that are desirably prevented from reaching portions of a photovoltaic cell are often simply referred to herein as UV wavelengths of light. Accordingly, in order to reach commercial readiness, there is currently a great need in the art for methods and materials to protect one or more of the material layers formed in a perovskite containing photovoltaic (PV) cell from exposure to some of the ultraviolet radiation wavelengths. Embodiments described herein relate to methods for protecting stacked tandem photovoltaic cell assemblies from exposure to ultraviolet radiation, improving device durability, service life, and commercial viability.

Figures 1A, 1B:
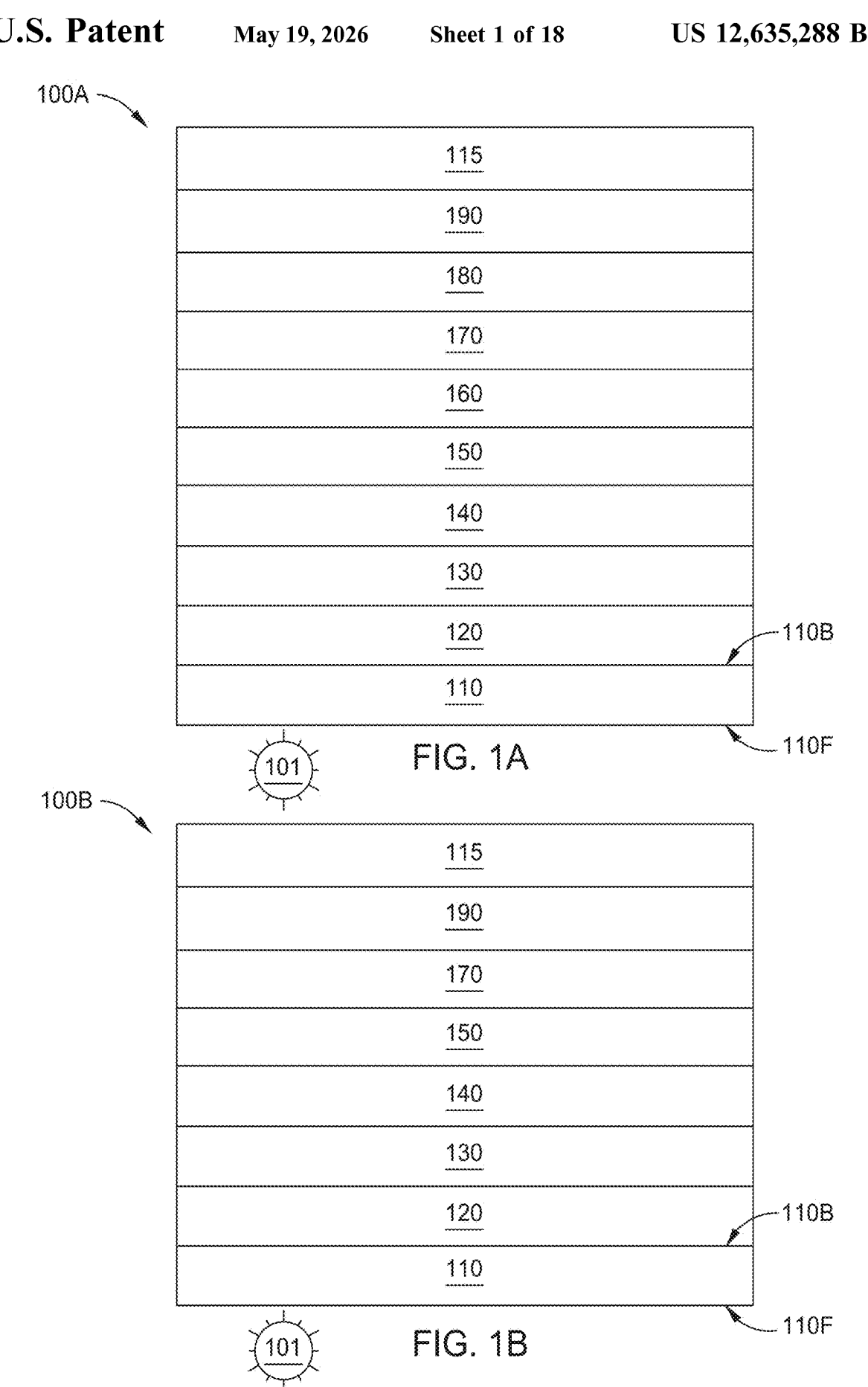
FIG. 1A illustrates an exemplary device stack that includes multiple layers that may be used in a fully functioning photovoltaic cell and/or solar module, according to one or more embodiments.
FIG. 1B illustrates another example photovoltaic device stack that includes multiple layers that may be used in a fully functioning photovoltaic cell and/or solar module, according to one or more embodiments.

FIG. 1A illustrates an exemplary device stack that includes multiple layers that may be used in a fully functioning photovoltaic cell and/or solar module, according to one or more embodiments.

In some embodiments of the present disclosure, a device 100, (e.g., a photovoltaic cell) may include, in order, a first substrate 110, a first contact layer 120, a first charge transport layer (CTL) 130, an absorber layer 140 (e.g., a perovskite layer), a second charge transport layer (CTL) 150, a second contact layer 170, one or more barrier layers 180, an encapsulation layer 190, and a second substrate layer 115. To facilitate understanding, identical reference numerals have been used, where possible, to designate identical elements that are common to the figures. It is contemplated that elements and features of one embodiment may be beneficially incorporated in other embodiments without further recitation.

In some embodiments, the first substrate 110 can include one or more materials selected from a group that includes a metal foil, silicon, glass, and/or a polymer substrate. In some embodiments, the first substrate 110 can include glass with a thickness between about 1 and 5 mm, more preferably between 2 and 3.2 mm. In some embodiments, the first substrate 110 can include metal foil and/or a polymer with a thickness between about 50 $\mu$m and 500 $\mu$m, more preferably between 40 $\mu$m and 150 $\mu$m. The first substrate 110 can include a roughened surface on which the various layers of the photovoltaic device stack are to be formed, wherein the roughened surface has a peak-to-valley roughness between about 1 nm to about 10 $\mu$m. For example, a peak-to valley roughness is about 1 micrometer ($\mu$m).

The first contact layer 120 includes an electrical contact layer material and formed on a first surface of the first substrate 110. In some examples, the electrical contact layer material may include any suitable material, including, but not limited to, copper, silver, gold, indium tin oxide (ITO), fluorine doped tin oxide (FTO), indium zinc oxide (IZO), aluminum zinc oxide (AZO), or any combination thereof. In one example, the first contact layer 120 includes a transparent conductive oxide (TCO) layer, such as indium tin oxide (ITO), fluorine doped tin oxide (FTO), indium zinc oxide (IZO), or aluminum zinc oxide (AZO). However, to protect the device 100 from UV radiation the first contact material may be a zinc oxide (ZnO) material. In some embodiments, the first contact layer 120 may have include one or more layers, where each layer of the plurality of layers includes a contact layer material, such as a transparent conductive oxide layer. The first contact layer 120 can have a first contact thickness between about 5 nanometers (nm) to about 1000 nm. If the first contact layer 120 includes ZnO (FIG. 12), the thickness of the contact layer can have a first contact thickness between about 200 nm to about 1000 nm. Although, the first contact layer 120 can comprise ZnO to provide some protection to the device 100 from UV radiation, in some embodiments, the device 100 may be additionally or alternately be protected from UV radiation by adding UV blocking layer(s) as described below. Stated otherwise, the device 100 may be protected from UV radiation by the first contact layer 120 comprising ZnO and/or protected from UV radiation via additionally formed UV blocking layer(s) that will be discussed in more detail below.

The first charge transport layer (CTL) 130 may be formed over the first contact layer 120. In some embodiments, the first CTL 130 has a first CTL thickness between about 0.1 nm to about 10 $\mu$m, preferably between about 1 to 100 nm, more preferably between 10 to 70 nm. In some embodiments, the first CTL 130 may be configured to act as a hole transport layer (HTL) including a hole transport material, or to act as an electron transport layer (ETL) including an electron transport material. In some embodiments, the first CTL 130 may include a plurality of layers, where each layer of the plurality of layers may include a different material dependent upon the configuration (e.g., HTL versus ETL) of the first CTL 130. The first CTL 130 is an HTL that includes, but are not limited to, PTAA, Poly-TPD, nickel oxide, molybdenum oxide, OMATD, self-assembled monolayers (SAM), [2-(9H-carbazol-9-yl)ethyl]phosphonic acid (2PACz), (2-(3,6-Dimethoxy-9H-carbazol-9-yl)ethyl)phosphonic acid (MeO-2PACz), or (4-(3,6-Dimethyl-9H-carba-zol-9-yl)butyl)phosphonic acid (Me-4PACz), (2-(3,6-Di-bromo-9H-carbazol-9-yl) ethyl)phosphonic acid (Br-2PACz), or combinations thereof. As discussed above, in some embodiments, the first CTL 130, being configured to act as an HTL, may include a plurality of layers where each layer of the plurality of layers may include a different hole transport material. The different hole transport materials may include, but are not limited to, nickel oxide, PTAA, a SAM, or the like. For example, a multilayer HTL may include a plurality of layers where the plurality of layers comprise, nickel oxide and PTAA, nickel oxide and a SAM, a SAM and PTAA, or the like. As discussed above, in some embodiments, the first CTL 130, being configured to act as an ETL, may include a plurality of layers where each layer of the plurality of layers may include a different electron transport material. The different electron transport materials may include, but are not limited combinations of tin dioxide ($SnO_2$), a SAM, titanium dioxide ($TiO_2$), zinc oxide (ZnO), or the like. For example, a multilayer ETL may a plurality of layers, where the plurality of layers comprise $SnO_2$ and a SAM, $TiO_2$ and ZnO, or the like.

The absorber layer 140 is formed over the first CTL 130. In some embodiments, the absorber layer 140 is disposed on the first CTL 130. The absorber layer 140 includes an absorber material, the absorber material may include, a perovskite material, which is described above. In one example, the absorber layer includes a perovskite material that has the stoichiometry of $ABX_3$, where A is a first cation, B is a second cation, and X comprises at least one halide (e.g., chloride, bromide, or iodide). In another example, the absorber layer 140 includes a perovskite that has a stoichiometry of $ABX_3$, where A comprises at least one of forma-midinium (FA), methylammonium (MA), or cesium, and B comprises at least one of tin or lead, and X comprises at least one halide, methylammonium lead tri-iodide (MAPbl3), cesium formamidinium methylammonium lead tri-iodide ($CsFAMAPbl_3$), silicon (amorphous and/or crystalline), Group III-V materials (amorphous and/or crystalline), organic photovoltaic materials (OPV), dye-sensitized solar cells (DSSX), copper indium gallium selenide (CIGS), cad-mium telluride (CdTe), or combinations thereof. The absorber layer 140 may have an absorber layer thickness between about 300 nm to about 1000 nm. For example, the absorber thickness is between about 450 nm to about 950 nm, preferably between about 500 nm to about 650 nm. In some embodiments, the absorber layer 140 may have an absorber thickness between about 1000 nm to about 2000 nm.

The second charge transport layer (CTL) 150 may be deposited over the absorber layer 140. The second CTL 150 may be configured to act as a hole transport layer (HTL) including a hole transport material, or to act as an electron transport layer (ETL) including an electron transport mate-rial, which is an opposite type of layer as the first CTL 130. In some embodiments, the second CTL 150 may include a plurality of layers, where each layer of the plurality of layers may include a different material dependent upon the con-figuration (e.g., HTL versus ETL) of the second CTL 150. In one example, the second CTL 150 is an ETL that includes, but is not limited to, a metal oxide such as at least one of $TiO_2$, $SnO_2$, $Al_2O_3$, ZnO, or carbon contacts such as carbon nanotubes, fullerenes (e.g., $C_{60}$ and or $C_{70}$), a fullerene derivative [6,6]-phenyl-C61-butyric acid methyl ester (PCBM), or fullerenes used alone or in conjunction with bathocuproine (BCP) or $SnO_2$, or other metal oxide, or combination thereof. As discussed above, in some embodiments, the second CTL 150, being configured to act as an ETL, may include a plurality of layers where each layer of the plurality of layers may include a different electron transport material. For example, a multilayer ETL may include a plurality of layers where the plurality of layers comprise $C_{60}$ or a SAM, $C_{60}$ or BCP, or the like. The second CTL 150 has a second CTL thickness between about 0.1 nm to about 1 μm. In one or more embodiments, the first CTL 130 and the second CTL 150 may be different doped differently of layers. For example, the first CTL 130 may be an n-type layer and the second CTL may be a p-type layer (or vice versa).

In some embodiments, a second contact layer 170 is formed over the second CTL 150. The second contact layer 170 material may be the same or different from the first contact layer material.

In other embodiments, the second charge transport layer (CTL) 150 may be deposited over a buffer layer 160 formed over the absorber layer 140. Thus, the buffer layer 160 may be disposed over the exposed portions of the absorber layer 140. In another example, the buffer layer 160 may be formed between the second CTL 150 and the second contact layer 170. As will be discussed further below, the buffer layer 160 may typically include a material that has a bandgap larger than the absorber layer 140, which may be used to passivate the perovskite surface and/or slow the surface recombination rate, create a tunneling barrier, and/or otherwise change the interfacial properties between absorber layer 140 and the second CTL 150.

The barrier layer 180 is disposed over the second contact layer 170. The barrier layer 180 can include one or more barrier layers. The one or more barrier layers include a barrier material. Each barrier layer of the one or more barrier layers may include a different barrier material. The barrier materials of the one or more barrier layers may include a metal oxide. In one example, the one or more barrier layers include, but are not limited to, a material that comprises aluminum oxide, silicon oxide, tin oxide, titanium oxide, zirconium oxide, or combination thereof. The barrier mate-rials of the one or more barrier layers may include a styrenic polymer, a polysiloxane, an amine-containing polymer, a polyacrylate, an aryl ammonium halide, an alkyl ammonium halide, a fluorinated hydrocarbon polymer, or a combination thereof. In another example, the one or more barrier layers include, but are not limited to, a styrenic polymer such as polystyrene (PS), acrylonitrile butadiene styrene (ABS), acrylonitrile-styrene-acrylate (ASA) or styrene-butadiene rubber (SBR). In another example, the one or more barrier layers include, but are not limited to, a polysiloxane such as poly(dimethylsiloxane), poly(diethylsiloxane) or poly (methylphenylsiloxane). In another example, the one or more barrier layers include, but are not limited to, a amine-containing polymer such as polyethylenimine (PEIE), poly (vinylamine) hydrochloride (PVH), or poly(ethylene glycol) bis(amine) (PEG-Amine). In another example, the one or more barrier layers include, but are not limited to, a poly-acrylate such as polymethylmethacrylate (PMMA) or poly-ethylacrylate. In another example, the one or more barrier layers include, but are not limited to, an aryl ammonium halide such as phenethylammonium iodide (PEAI), 1-(am-monium acetyl)pyrene (PEY) or dodecyl ammonium-chlo-ride (DACI). In another example, the one or more barrier layers include, but are not limited to, an alkyl ammonium halide such as n-propylammonium iodide (PAI), ethane-1, 2-diammonium (EDA), 2-chloroethylamine (CEA) or 2-bromo-ethylamine (BEA). In another example, the one or more barrier layers include, but are not limited to, a fluorinated hydrocarbon polymer such as Nafion™, polytetrafluoroethylene, polyvinylidene-fluoride, or trifluoroethylene. The one or more barrier layers have a barrier thickness between about 1 nm to about 5 μm.

The encapsulation layer 190 can disposed over the second contact layer 170. The encapsulation layer 190 includes an encapsulation material. The encapsulation material may include, but is not limited to, ethylene vinyl acetate (EVA), polyolefin, polyurethane, polyvinyl butyral, ionomers or combination thereof. The encapsulation layer 190 has an encapsulation thickness between about 0.1 mm to about 5 mm.

The second substrate layer 115 is disposed on and/or coupled to the encapsulation layer 190. The second substrate layer 115 has a second substrate thickness between about 0.05 mm to about 5 mm. In some embodiments, as discussed above, second substrate layer 115 can include one or more materials selected from a group that includes a metal foil, silicon, glass, and/or a polymer substrate. In some embodiments, the second substrate layer 115 is glass with a thickness between about 1 mm and 3 mm.

Referring again to FIG. 1A, the device 100 illustrated may include only a portion of a PV cell, versus a module, in that the device shown does not include scribe lines that are used to separate the absorber layer and/or other layers into individual series connected cells within a formed module.

The device 100, described herein may be a multilayer, stacked device that can include p-i-n or n-i-p type configuration. In one example, a PV cell may include, in order, a first charge transport layer (CTL) 130 that is a hole-transport-layer (HTL), an absorber layer 140 (e.g., a perovskite layer), a second charge transport layer (CTL) 150 that is an electron-transport-layer (ETL), a second contact layer 170, and an optional one or more barrier layers 180. In another example, a PV cell may include, in order, a first charge transport layer (CTL) 130 that is an electron-transport-layer (ETL), an absorber layer 140 (e.g., a perovskite layer), a second charge transport layer (CTL) 150 that is a hole-transport-layer (HTL), a second contact layer 170, and an optional one or more barrier layers 180.

FIG. 1B illustrates another example photovoltaic device stack that includes multiple layers that may be used in a fully functioning photovoltaic cell and/or solar module, according to one or more embodiments. As illustrated in FIG. 1B, the one or more barrier layers 180 were optionally removed. For example, the device 100B may include, in order, the first substrate 110, the first contact layer 120, the first CTL 130, the absorber layer 140, the second CTL 150, the second contact layer 170, the encapsulation layer 190, and the second substrate layer 115.

In some embodiments, either of the devices 100A or 100B illustrated in FIG. 1A or 1B may be protected from exposure to undesirable wavelengths of light, such as UV wavelengths of light, by forming an UV blocking layer on or within the first substrate 110. Formed devices, as shown, for example, in FIGS. 2A and 2B. In some embodiments, UV blocking layers are constructed from oxides. For a wide acceptance band UV blocking layer on glass, the ideal UV blocking layer has a refractive index (RI) of 1.23. The solid UV blocking layer material that is closest to having an RI of 1.23 is magnesium fluoride ($MgF_2$), which has an RI of 1.38. However $MgF_2$ still results in an imperfect anti-reflection.

Therefore, it is desirable to form an UV blocking layer, which includes an improved RI (an RI closest to the ideal RI) that is configured to filter out undesirable wavelengths of light that can cause damage to one or more layers within a formed device 100. One with ordinary skill in the art would understand that a materials' RI varies as a function of wavelength. It is understood that the quoted RI values herein are described with respect to a 589.3 nm wavelength unless otherwise specified.

Figures 2A, 2B:
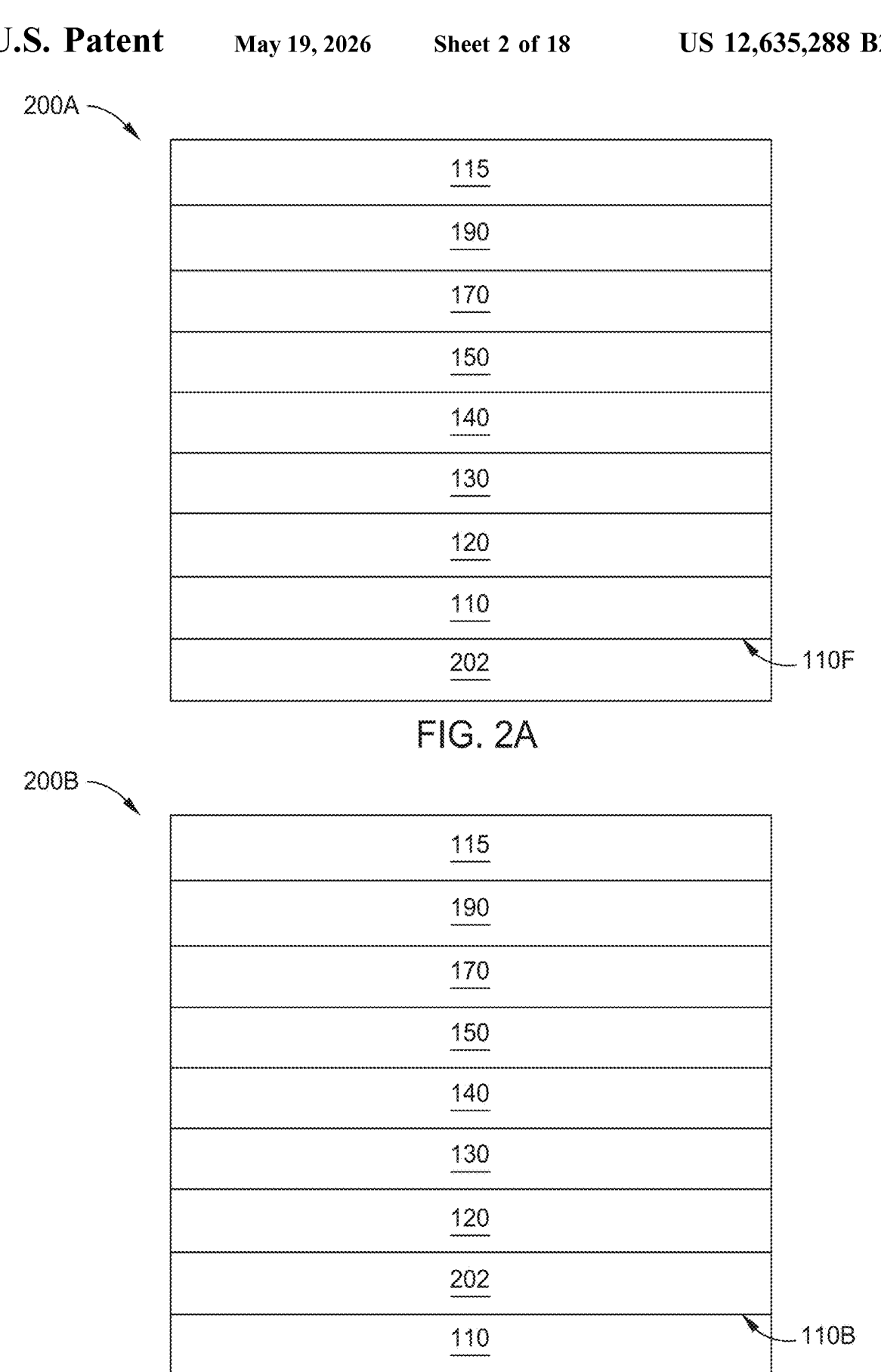
FIGS. 2A-2B illustrate an exemplary device stack that includes an ultraviolet (UV) blocking layer according to one or more embodiments.

FIGS. 2A-2B illustrate a photovoltaic device stack that includes a UV blocking layer 202 according to one or more embodiments. While FIGS. 2A and 2B, which include devices 200A and 200B, respectively, illustrate a simplified set of device layers within a formed device (i.e., device 100B (FIG. 1B)) this configuration is not intended to be limiting as to the scope of the disclosure provided herein. As illustrated in FIGS. 2A-2B, at least one UV blocking layer, such as an UV blocking layer 202 may be formed on the first substrate 110 or within the device (e.g., device 200B). In one embodiment, as illustrated in FIG. 2A, the UV blocking layer 202 may be formed on the frontside 110F of the first substrate 110. In another embodiment, the UV blocking layer 202 may be formed on a backside 110B of the first substrate 110. In other embodiments, where sunlight is provided on the second substrate layer 115 side of the device, the UV blocking layer 202 may be formed on the exposed side (e.g., topside in FIG. 2A) of the second substrate layer 115, formed on the internal side of the second substrate layer 115, or formed in-between layers disposed between the second CTL 150 and the internal side of the second substrate layer 115. As will be discussed further below the UV blocking layer can be a single layer of material or a multilayer stack of materials that are configured to act as an anti-reflective coating or a reflective coating and block undesirable wavelengths of light, such as block wavelengths of light within the ultraviolet (UV) and blue light wavelengths of the solar spectrum from reaching one or more layers within the photovoltaic device stack. In some embodiments, it is desirable for the UV blocking layer 202 to block wavelengths within at least one of three wavelength bands, which for convenience of discussion purposes is designated herein as band I=310-360 nm, band II=360-400 nm, and band III=400-430 nm.

In general, the formation of the UV blocking layer(s) needs to include a desirable amount of attenuation within a desired wavelength range, such an optical density (OD) attenuation of about three decibels (dB) at wavelengths between 300 nm and 400 nm. However, the presence of an UV blocking layer should not also block wavelengths that are needed to generate power and thus adversely affect the efficiency to photovoltaic (PV) device. In some embodiments, it is desirable to assure that a percentage transmission of light through the UV blocking layer(s) within wavelengths greater 450 nm, such as wavelengths in a range between 450 nm and 1000 nm be at least 90%, such greater than 95%, greater than 97%, or even greater than 99%.

Photovoltaic Device Examples

Figure 3A:
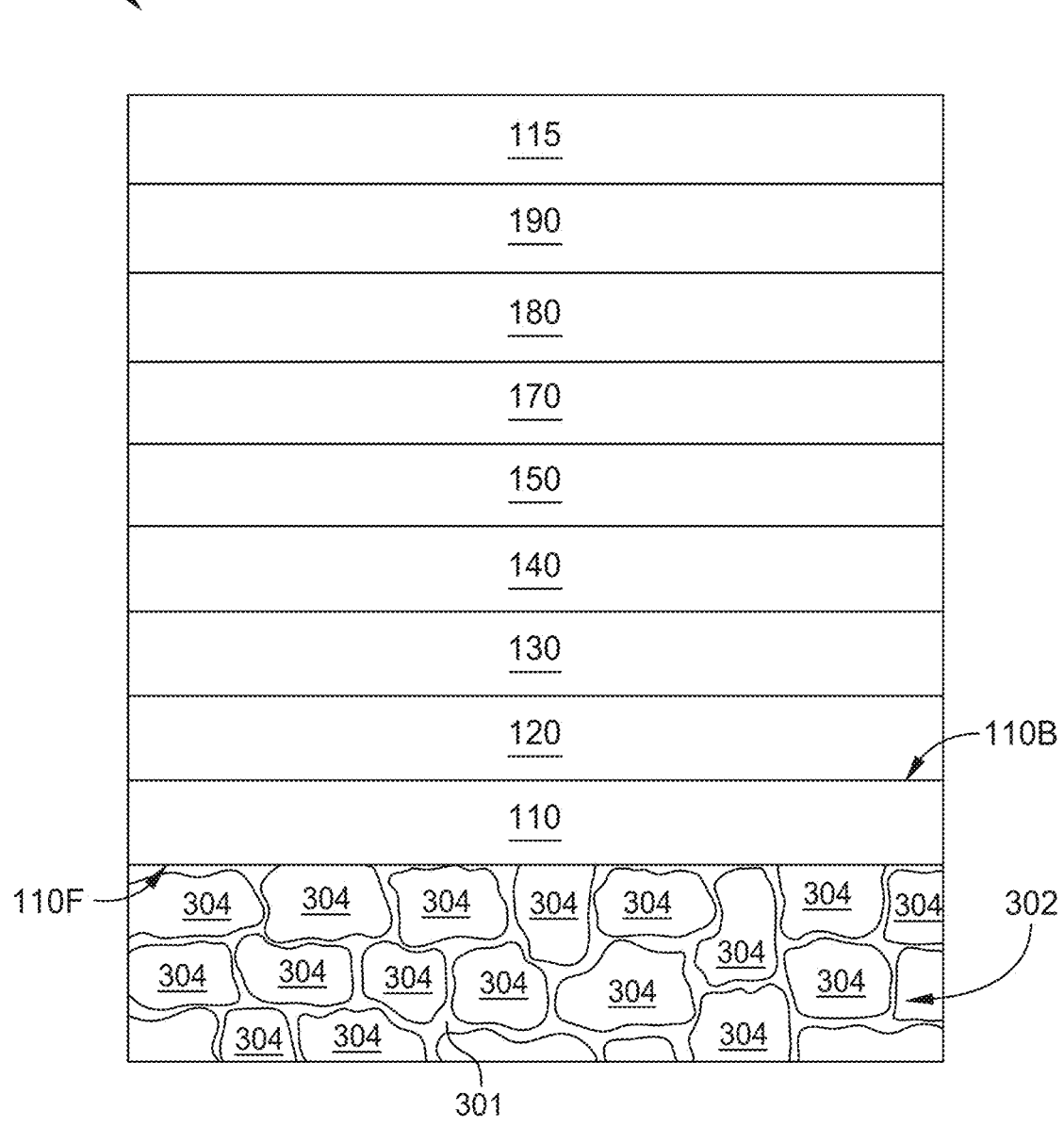
FIGS. 3A-3B illustrate an exemplary device stack that includes an ultraviolet (UV) blocking layer according to one or more embodiments.
Figure 3B:
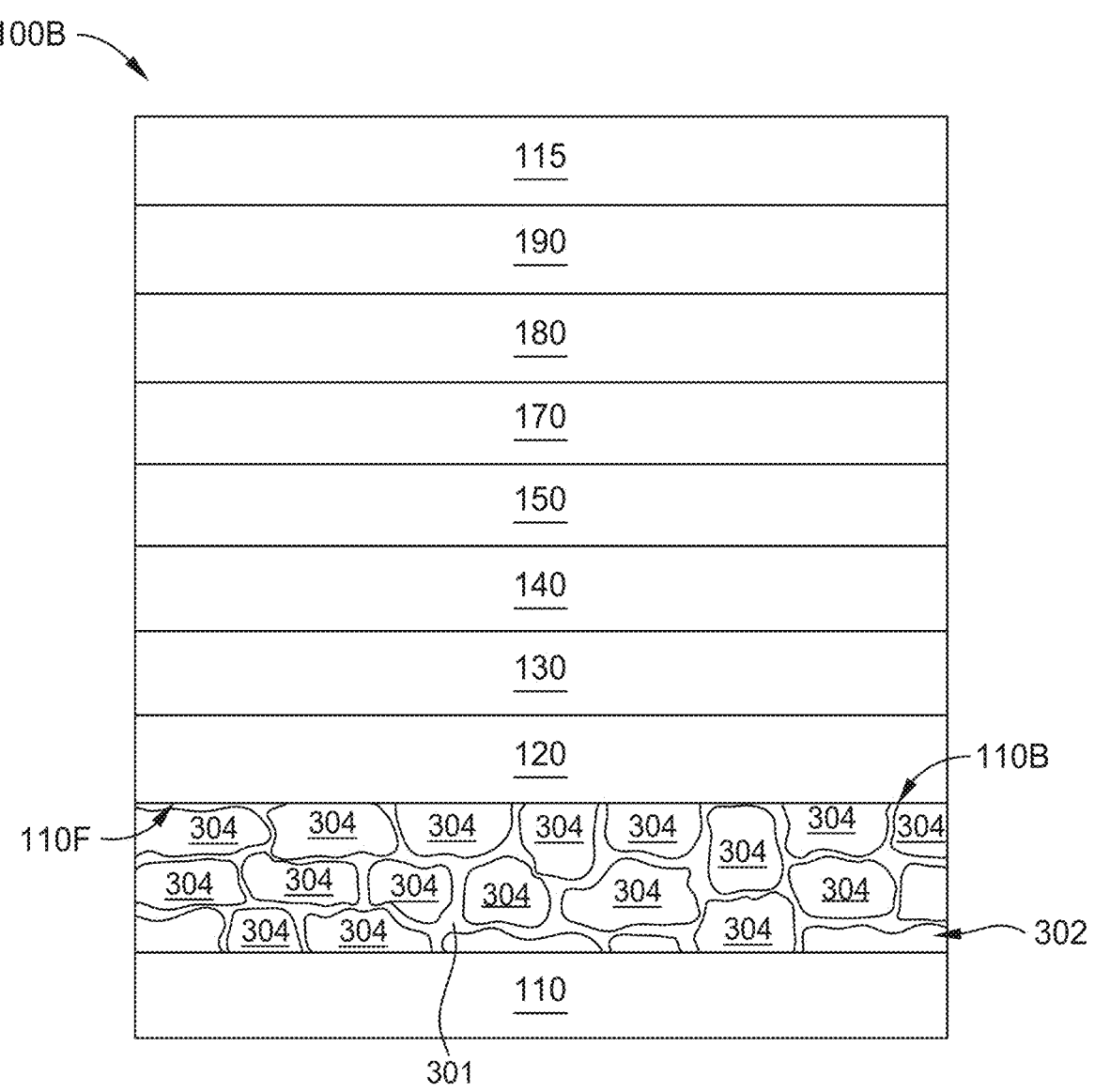

FIGS. 3A-3B illustrate an exemplary photovoltaic device stack that includes an ultraviolet (UV) blocking layer according to one or more embodiments. As illustrated in FIG. 3A, at least one UV blocking layer, such as an UV blocking layer 302 may be formed on a surface of the first substrate 110. In some embodiments, the UV blocking layer 302 may be formed on a surface of the first substrate 110 prior to forming any other of the other layers of the device 100A-100B.

In one embodiment, as illustrated in FIG. 3A the UV blocking layer 302 may be formed on the frontside 110F of the first substrate 110. In another embodiment, as illustrated in FIG. 3B, the UV blocking layer 302 may be formed on a backside 110B of the first substrate 110. As shown in FIG. 3A, to form an UV blocking layer with an RI close to or equal to the ideal RI, the UV blocking layer 302 may be formed from a porous material. Advantageously, in some embodiments, a porous UV blocking layer 302 allows ambient air to mix with a solid material to achieve desired optical properties. In these cases, it is desirable for the porous UV blocking layer 302 to include pore structures 301 that include pores, channels or networks of open regions that are on the size and length scale of the wavelength of light. In one example, it is desirable for the pore structure containing UV blocking layer 302 is configured to block wavelengths of light within the ultraviolet (UV) and blue light wavelengths. In some embodiments, it is desirable to block wavelengths within at least one of three wavelength bands of light within band I, band II, and/or band III.

In some embodiments, the porous UV blocking layer 302 may include particles 304 that include one or more materials, such as a conductive oxide material. The UV blocking layer 302 (i.e., the particles 304) may be formed using a sol-gel method in which metal precursors are reacted with high temperature water to form the particles 304 directly onto the first substrate 110. In other embodiments, the UV blocking layer 302 may be formed by fabricating the particles 304 and then depositing the particles 304 directly onto the first substrate 110 with a binding material. In other embodiments, the UV blocking layer 302 may be formed by forming a liquid containing slurry (i.e., a slurry material) that includes the particles 304, depositing the slurry directly onto the first substrate 110, and then causing the removal of one or more liquid materials found in the slurry to cause the densification and binding of the remaining particles to the first substrate 110. The particles 304 may be deposited onto the first substrate 110 using any suitable processes such as spray-on coating, spin-on coating, slot-die coating, Gravure coating, aerosol impact driven coating, swift coating or the like.

In some examples, it would be a benefit to the absorber layer 140 material (perovskite) to eliminate at least UV wavelengths that cause degradation to the first CTL 130 materials (including but not limited to NiO) due to exposure to these wavelengths of light. Therefore, suitable particle 304 materials (oxides) include, but are not limited to, zinc oxide (ZnO), cerium dioxide (CeO$_2$), titanium dioxide (TiO$_2$), compound oxides, and the like. The oxides may be doped or undoped. In some examples, the oxides may be lightly doped. For example, the particle 304 material may be undoped ZnO, doped ZnO, or lightly doped ZnO.

As shown in FIG. 3A, the particles 304 may have any suitable shape and size. For example, the particles 304 may be spherical, crystalline, hexagonal, rod, needle, cube, amorphous, or triangular shaped. For example, the particles 304 may be spheres having close-packed fill volume of 68%, creating voids that account for 32% of the volume of the formed UV blocking layer 302. The voids can contain a fluid or a gas, such as air. The close-packed fill volume can be based on the shape of the particles 304 and compression forces applied in forming the UV blocking layer 302.

In some examples, the particles 304 may be a combination of oxides. For example, a solid layer of ZnO has an RI of 1.95, which is undesirably high for use in an UV blocking layer for the purposes described herein. Therefore, the UV blocking layer 302 can comprise a porous structure that includes ZnO particles. Advantageously, in one configuration, the ZnO particles within the formed porous structure includes the pore structures 301 that includes pores, channels or networks of pores that include air to form an UV blocking layer 302 that has a lower composite RI to ensure that the RI is as close as possible, or equal, to an ideal RI, such as an RI of about 1.23 at a wavelength of 589 nm. In another configuration, the UV blocking layer 302 includes the ZnO particles, at least one other oxide containing particle (e.g., SiO$_2$ particles (RI~1.46)) and a formed porous structure that include air to form an UV blocking layer 302 that has a desirable composite RI close to an ideal RI. In one or more examples, to achieve UV-filtration, the porous UV blocking layer 302 has a thickness between 1 micrometer (μm) and 10 μm. While some of the thin-film interference benefit is lost at these thicknesses the graded index benefit is maintained.

The particles 304 may be nano-sized, micro-sized, or the like. In some embodiments, the particles 304 have an average size between about 1 and 200 nm in size, such as between about 5 and 50 nm. In other embodiments, the particles 304 have a D90 particle distribution size of about 200 μm, or about 100 μm, or even about 50 μm.

In some embodiments, the particles 304 disposed within the UV blocking layer 302 may be hollow. The hollow particles can include a gas, such as air or nitrogen within a hollow center region of the hollow particle so as to form an UV blocking layer 302 that has desirable optical properties, such as desirable attenuation and transmission properties. In one example, the outer shell of the hollow particles may include a material such as SiO$_2$, styrene, acrylic, phenolic resins, or other suitable material.

In another embodiment, a porous UV blocking layer 302 may be formed by encapsulating the particles 304 in a solid material on the surface of the first substrate 110, and then removing the solid material that surround the particles 304, leaving the particles 304 remaining on the first substrate 110. For example, the solid material may include cellulose, which may be burned off after deposition.

Multilayer UV blocking Layer Configuration

In some embodiments, to protect the photovoltaic device from UV radiation an UV blocking layer is formed which includes a stack of material layers that are disposed on the frontside 110F of the first substrate 110 or disposed on the backside 110B of the first substrate 110, between the first substrate 110 and the first contact layer 120.

Figure 4A:
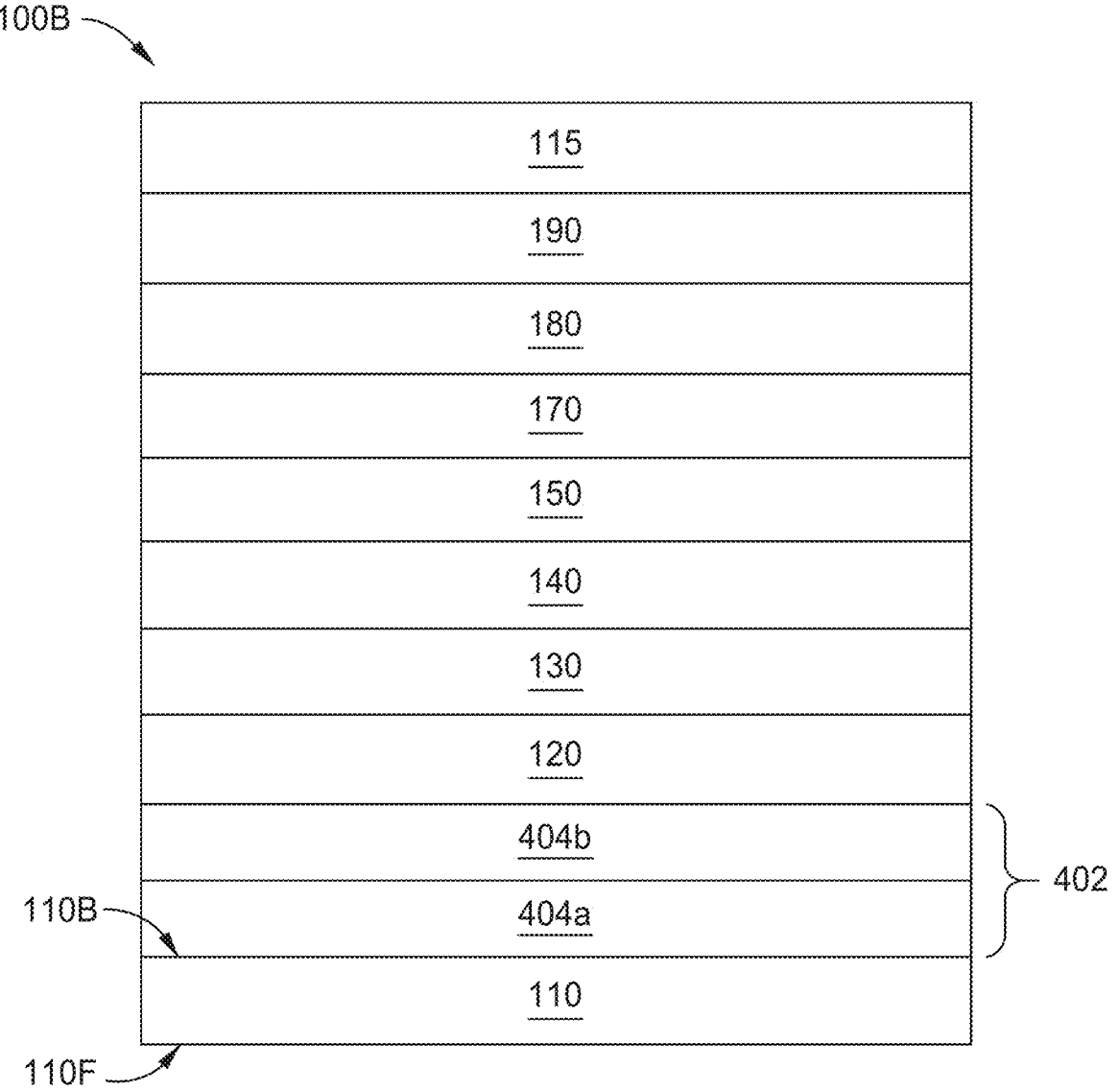
FIGS. 4A-4B illustrate an exemplary device stack that includes at least one ultraviolet (UV) blocking layer according to one or more embodiments.
Figure 4B:
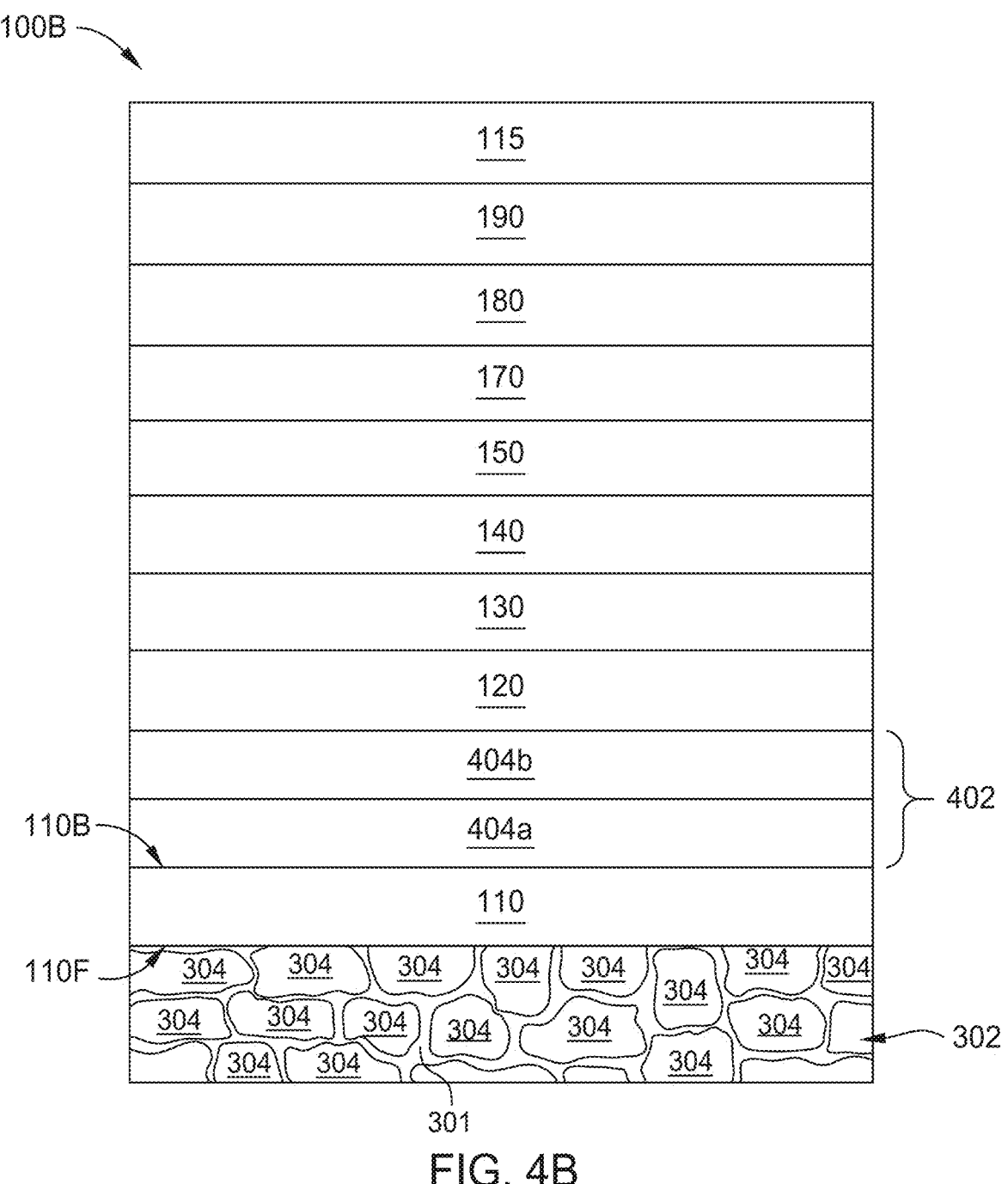

FIGS. 4A-4B illustrate an exemplary photovoltaic device stack that includes an UV blocking layer that includes two or more UV blocking sub-layers according to one or more embodiments.

As illustrated in FIG. 4A a UV blocking layer 402 includes a plurality of sub-layers formed on a surface of the first substrate 110. In one example, as shown in FIG. 4A, the UV blocking layer 402 is formed between the first substrate 110 and the first contact layer 120. The UV blocking layer 402 can serve at least two purposes: act as a diffusion barrier to ions in the first substrate 110 (e.g., sodium (Na)) and index matching to protect the device 100A, 100B from detrimental UV radiation. In some embodiments, the UV blocking layer 402 includes a multilayer stack that includes a repeating set sub-layers.

The multilayer stack type structure can be formed from multiple sub-layers of alternating materials with different refractive index, or by periodic variation of some characteristic (such as thickness) of the alternating material layers, resulting in periodic variation in the effective refractive index in the UV blocking layer 402. Each layer boundary of the formed sub-layers causes a partial reflection and refraction of an optical wave. In one example, the repeating set sub-layers includes a first sub-layer 404A and a second sub-layer 404B. In some embodiments, the difference between the RI of the first sub-layer 404A to the second sub-layer 404B is between about 0.75 and about 1.5. The first sub-layer 404A may be a material with an RI close the RI of the first substrate 110 material, such as silicon dioxide ($SiO_2$) in embodiments in which the first substrate 110 is formed from glass. In some embodiments, the difference between the RI of the first substrate 110 and the first sub-layer 404A is less than or equal to 1.3. In other embodiments, the difference between the RI of the first substrate 110 and the first sub-layer 404A is less than or equal to 0.83. The second sub-layer 404B may be a material with an RI close to the RI of the first contact layer 120 layer such as tin oxide ($SnO_2$), titanium dioxide ($TiO_2$), or niobium pentoxide ($Nb_2O_5$), or the like. In one or more embodiments, the repeating set sub-layers of the UV blocking layer 402 may be configured to form an efficient UV radiation filter. In one example, the layers of the UV blocking layer 402, such as the first sub-layer 404A and the second sub-layer 404B, can be expanded with multiple repeating units to generate a long-pass filter. For example the UV blocking layer 402 may include a series repeat pairs of sub-layers, such as the first sub-layer 404A and the second sub-layer 404B. Based on the thickness of the first sub-layer 404A and the second sub-layer 404B the UV blocking layer 402 can be configured to reflect only UV light and transmit all other wavelengths.

Additionally, or alternatively, the repeating set sub-layers of the UV blocking layers 402 may include UV filtering materials, such as UV absorbing materials, such as zinc oxide (ZnO), cerium dioxide ($CeO_2$), titanium dioxide ($TiO_2$), compounds thereof, and the like. In some embodiments, the sub-layers of the UV blocking layers can include UV reflecting materials, such as silica ($SiO_2$) or alumina ($Al_2O_3$). The UV filtering materials may be the material of an entire layer of the UV blocking layer 402, or may be included in the second sub-layer 404B such as with nanoparticles in the manner discussed above.

As discussed above, the formation of the multilayer stack type of UV blocking layer 402 needs to include a desirable amount of attenuation within a desired wavelength range, such an optical density (OD) attenuation of about three decibels (dB) at wavelengths between 300 and 400 nm, while not significantly blocking wavelengths (e.g., wavelengths 450-1000 nm) that are needed to generate power. Thus, a tradeoff exists to meet the attenuation and transmission requirements, which includes index of refraction difference between the first sub-layer 404A and the second sub-layer 404B, and the number of first and second sub-layers to achieve the desired filtering result. The first sub-layer 404A and the second sub-layer 404B can be characterized as being either a high RI and a low RI material. It has been found that a refractive index difference ≥1.23 is feasible with selected thin film materials. In one example, repeating pairs of $SiO_2$ and $TiO_2$ layers have been found to achieve the desired attenuation and transmission properties, as shown in Table 1 below.

TABLE 1

| Filter specifications versus number of pairs of high/low index layers for a refractive index difference of 1.23 in the UV range. | | | |
|---|---|---|---|
| Sub-Layer Pairs | Attenuation @ 360 nm (dB) | Attenuation @ 400 nm (dB) | Transmission @ 450 nm (%) |
| 5 | 2.2858 | 1.807098 | 0.552596 |
| 10 | 4.125915 | 2.368302 | 0.939002 |

12

TABLE 1-continued

| Filter specifications versus number of pairs of high/low index layers for a refractive index difference of 1.23 in the UV range. | | | |
|---|---|---|---|
| Sub-Layer Pairs | Attenuation @ 360 nm (dB) | Attenuation @ 400 nm (dB) | Transmission @ 450 nm (%) |
| 15 | 4.494264 | 2.814583 | 0.958718 |
| 20 | 5.417011 | 3.160524 | 0.947983 |

In some embodiments, the sub-layer thicknesses can be adjusted so that they differ from first sub-layer to second sub-layer with a repeating pair of sub-layers and also from the nearest adjacent first sub-layer to first sub-layer and second sub-layer to second sublayer. The amount of thickness variation for the sub-layers can be in a range between 1 nm and 200 nm. It is believed that different combinations of sub-layer thicknesses within UV blocking layer 402 can lead to similar attenuation and transmission performance. An example of a layer stack that meets the desired criteria is given in Table 2, where the refractive index and thickness are given for each layer.

TABLE 2

| Sub-layer thicknesses and indices for an UV blocking layer 402 that meets the criteria set out above. | | |
|---|---|---|
| Material | Layer Thickness (nm) | RI (n) @ 360 nm |
| First contact layer 120 (ITO) | 110 | 2.31505 |
| TiO2 | 29.156 | 2.749847 |
| SiO2 | 43.009 | 1.517855 |
| TiO2 | 17.681 | 2.749847 |
| SiO2 | 126.211 | 1.517855 |
| TiO2 | 16.918 | 2.749847 |
| SiO2 | 42.127 | 1.517855 |
| TiO2 | 74.384 | 2.749847 |
| SiO2 | 18.974 | 1.517855 |
| TiO2 | 36.808 | 2.749847 |
| SiO2 | 93.752 | 1.517855 |
| TiO2 | 6.183 | 2.749847 |
| SiO2 | 103.21 | 1.517855 |
| TiO2 | 33.983 | 2.749847 |
| SiO2 | 36.04 | 1.517855 |
| TiO2 | 47.567 | 2.749847 |
| SiO2 | 59.5 | 1.517855 |
| TiO2 | 19.214 | 2.749847 |
| SiO2 | 96.206 | 1.517855 |
| TiO2 | 27.929 | 2.749847 |
| SiO2 | 43.377 | 1.517855 |
| TiO2 | 48.546 | 2.749847 |
| SiO2 | 47.921 | 1.517855 |
| TiO2 | 23.897 | 2.749847 |
| SiO2 | 98.954 | 1.517855 |
| TiO2 | 17.379 | 2.749847 |
| SiO2 | 64.442 | 1.517855 |
| TiO2 | 38.816 | 2.749847 |
| SiO2 | 39.988 | 1.517855 |
| TiO2 | 35.622 | 2.749847 |
| SiO2 | 64.838 | 1.517855 |
| TiO2 | 18.636 | 2.749847 |
| SiO2 | 83.971 | 1.517855 |
| TiO2 | 23.809 | 2.749847 |
| SiO2 | 52.887 | 1.517855 |
| TiO2 | 33.479 | 2.749847 |
| SiO2 | 46.103 | 1.517855 |
| TiO2 | 22.634 | 2.749847 |
| SiO2 | 58.014 | 1.517855 |
| TiO2 | 6.185 | 2.749847 |
| First substrate 110 (Glass) | 1,000,000. | 1.5 |

As illustrated in FIG. 4B, the device 100 can include the UV blocking layer 402 sandwiched between the first substrate 110 and the first contact layer 120, and the UV blocking layer 302 formed on the frontside 110F of the first substrate 110. In this example, a first sub-layer (i.e., $TiO_2$) of the multilayer stack has an RI that is higher than the RI of the first substrate 110 (i.e., glass) and the RI of the second sub-layer (i.e., $SiO_2$). Also, in this example, the last sub-layer (i.e., $TiO_2$) of the multilayer stack extending from the surface of the first substrate 110 has an RI that is higher than the RI of the first contact layer 120 (i.e., ITO) and the RI of the second to last sub-layer (i.e., $SiO_2$).

Photovoltaic Module Example

Figure 5A:
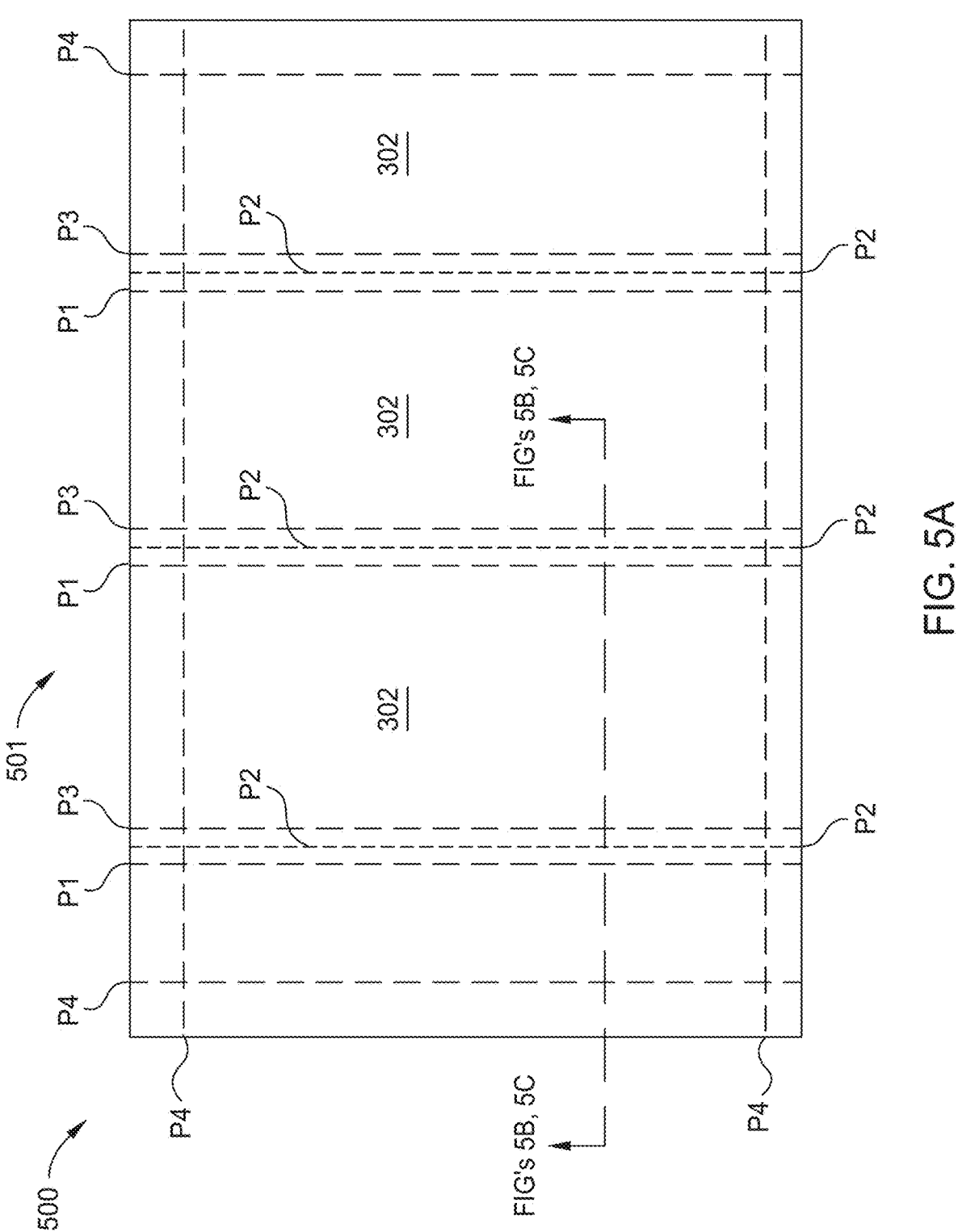
FIG. 5A illustrates a schematic plan view of a photovoltaic device that includes a photovoltaic device array according to one or more embodiments.

FIG. 5A illustrates a schematic plan view of a photovoltaic device 500, which is also referred to as a photovoltaic device 500, that includes a photovoltaic device array 501 according to one or more embodiments. The photovoltaic device array 501 includes a plurality of series connected photovoltaic cells 502. The photovoltaic device array 501 includes a plurality of features, such as a plurality of P1 scribe lines, a plurality of second scribe lines P2, a plurality of third scribe lines P3 that are used to form the series connected photovoltaic cells 502, a plurality of fourth scribe lines P4 that are used to separate and isolate the series connected photovoltaic cells 502 from the edge regions of the photovoltaic device 500. In some embodiments, the fourth scribe lines P4 surround the photovoltaic device array 501.

Figure 5B:
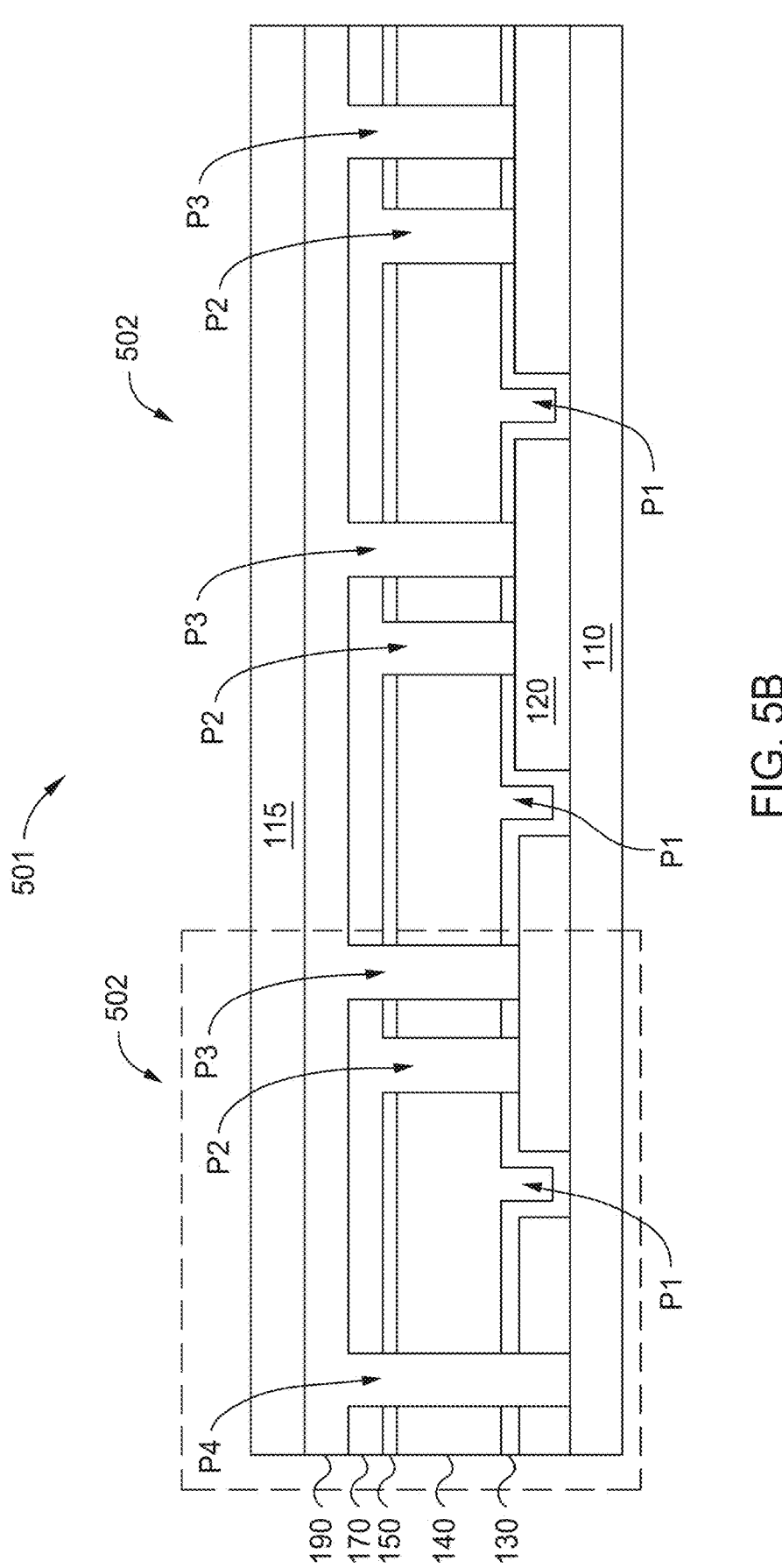
FIG. 5B illustrates a schematic side cross-sectional view of a portion of the photovoltaic device array, which includes a sectioned portion of the photovoltaic device array formed by the sectioning line 5B-5B shown in FIG. 5A, according to one or more embodiments.

FIG. 5B illustrates a schematic side cross-sectional view of a portion of the photovoltaic device array 501, which includes a sectioned portion of the photovoltaic device array 501 formed by the sectioning line 5B-5B shown in FIG. 5A. The sectioned portion of the photovoltaic device array 501 shown in FIG. 5B illustrates a configuration of a plurality of features, such as the P1 scribe line, the second scribe line P2, the third scribe line P3, and the fourth scribe line P4. The photovoltaic device array 501, shown in FIG. 5B, includes the first substrate 110, the first contact layer 120, the first CTL 130, the absorber layer 140, the second CTL 150, the second contact layer 170, a plurality of features, the encapsulation layer 190, and the second substrate layer 115.

Figure 5C:
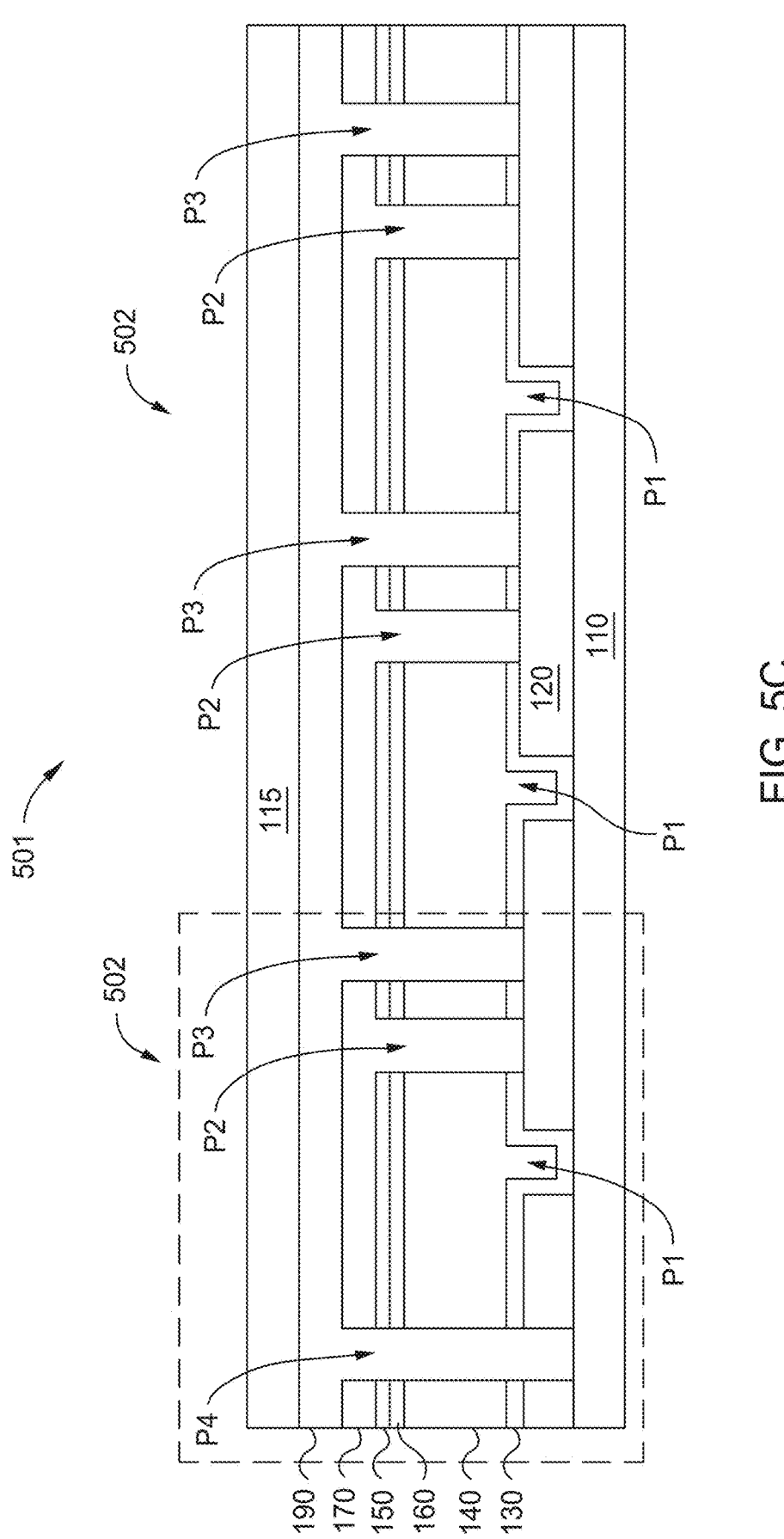
FIG. 5C illustrates a schematic side cross-sectional view of a portion of an alternately configured photovoltaic device array, which includes a sectioned portion of the photovoltaic device array formed by the sectioning line 5C-5C shown in FIG. 5A, according to one or more embodiments.

FIG. 5C illustrates a schematic side cross-sectional view of a portion of an alternately configured photovoltaic device array 501, which includes a sectioned portion of the photovoltaic device array 501 formed by the sectioning line 5C-5C shown in FIG. 5A. The sectioned portion of the photovoltaic device array 501 shown in FIG. 5C illustrates an alternate configuration that which similarly includes the plurality of features illustrated and described in relation to FIG. 5B. In some embodiments, the photovoltaic device array 501, shown in FIG. 5C, additionally includes a buffer layer 160 that can be disposed between the absorber layer 140 and second CTL 150. In other embodiments the buffer layer 160 may be disposed between the second CTL 150 and the second contact layer 170.

In some embodiments, the photovoltaic device array 501 includes a first substrate 110, a first contact layer 120, a first CTL 130, an absorber layer 140, a second CTL 150, a buffer layer 160, a second contact layer 170, a plurality of features, one or more barrier layers 180, an encapsulation layer 190, and a second substrate layer 115. In one configuration, as shown in FIG. 5C, the buffer layer 160 is disposed between absorber layer 140 and the second CTL 150, but other photovoltaic device stack configurations can benefit from the disclosure provided herein.

Example Method for Forming a Photovoltaic Device

FIG. 6 illustrates a method 600 of fabricating a photovoltaic cell within the photovoltaic device array 501 of the photovoltaic device 500 according to one or more embodiments. FIGS. 7A-7L illustrate schematic cross-sectional views of the photovoltaic cell 700 during various stages of the fabrication of the photovoltaic device which relate to the operations found in method 600 illustrated in FIG. 6. While FIGS. 6 and 7A-7L describe a process of forming one of many different photovoltaic device configurations this discussion is not intended to limit the scope of the disclosure provided herein.

Referring to FIG. 7A, the photovoltaic cell 700 includes the first substrate 110. The first substrate 110 has a first substrate thickness between about 50 μm to about 10 mm. In some embodiments, the first substrate 110 can include one or more materials selected from a group that includes a metal foil, silicon, glass, and/or a polymer substrate. In some embodiments, the first substrate 110 can include glass with a thickness between about 1 and 5 mm, more preferably between 2 and 3.2 mm. In some embodiments, the first substrate 110 can include metal foil and/or a polymer with a thickness between about 50 μm and 500 μm, more preferably between 40 μm and 150 μm. The first substrate 110 can include a roughened surface on which the various layers of the photovoltaic device stack are to be formed, wherein the roughened surface has a peak-to-valley roughness between about 1 nm to about 10 μm. For example, a peak-to valley roughness is about 1 micrometer (μm).

Figure 8:
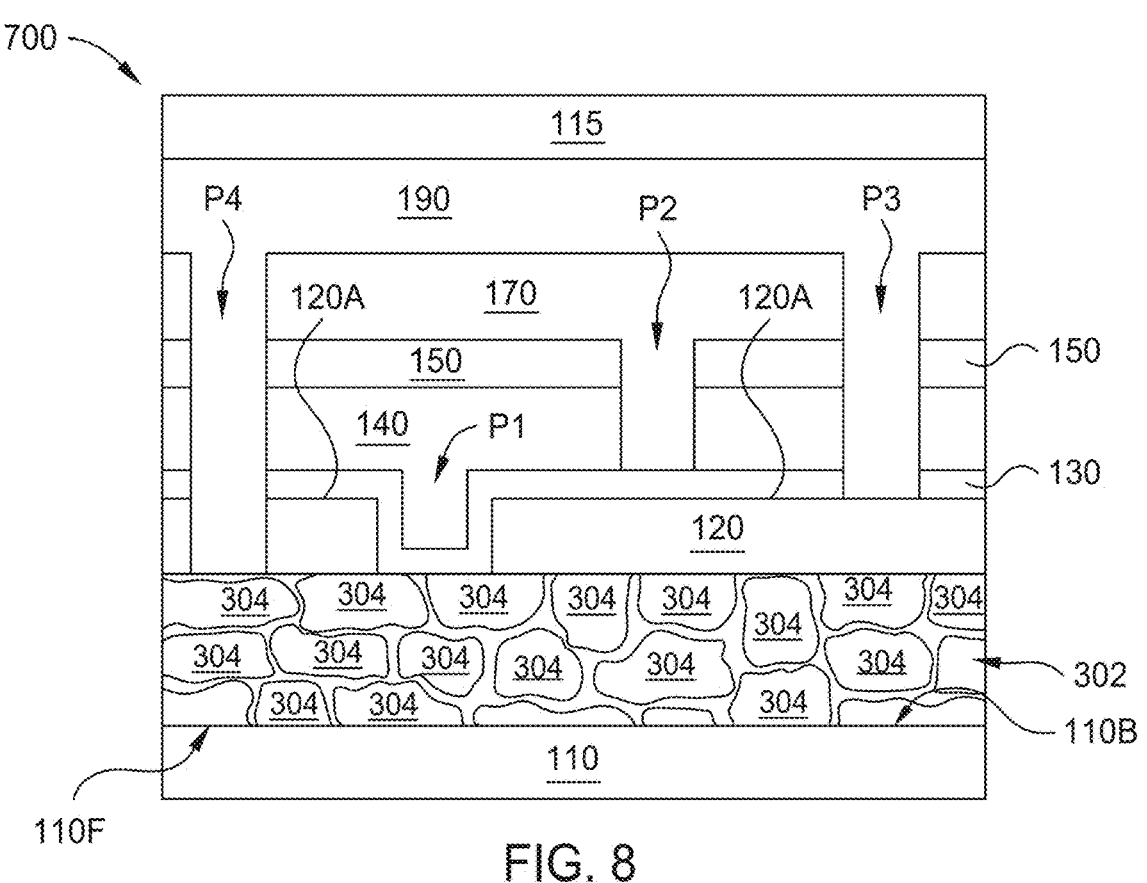
FIG. 8 illustrates a schematic side cross-sectional view the photovoltaic cell 700 according to one or more embodiments.
Figure 9:
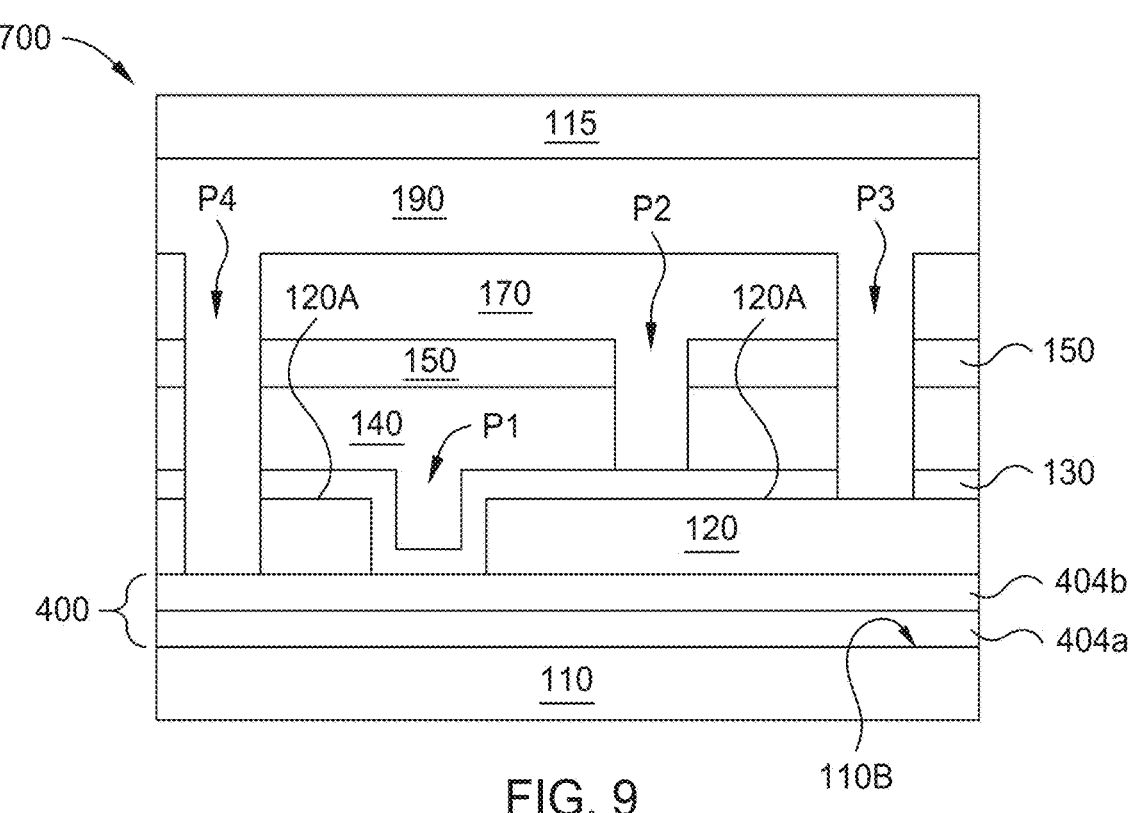
FIG. 9 illustrates a schematic side cross-sectional view the photovoltaic cell 700 according to one or more embodiments.
Figure 10:
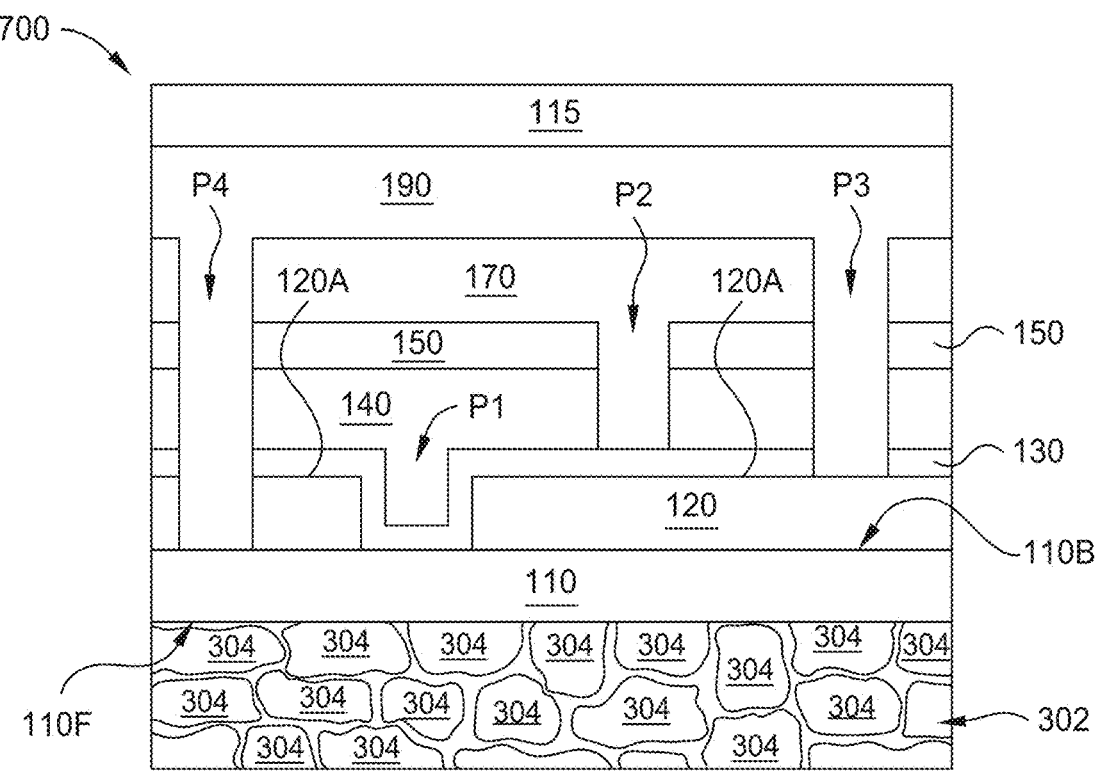
FIG. 10 illustrates a schematic side cross-sectional view the photovoltaic cell 700 according to one or more embodiments.

As illustrated in FIG. 7B, at operation 603 of the method 600, at least one UV blocking layer may be formed. In one example, as illustrated in FIG. 7B, an UV blocking layer 202 may be formed on a backside 110B of the first substrate 110 (FIGS. 8-9). In some embodiments, the UV blocking layer 202 may comprise the UV blocking layer 302 that is formed on the frontside 110F (FIG. 10). In one example, the UV blocking layer 302 is formed on the frontside 110F and/or backside 110B of the first substrate 110 by use of a slurry based doctor blade or squeegee application process, a spray-on deposition process, slot-die coating, spray-coating, gravure printing, or any combination thereof, or other similar process used to form a particle containing layer that includes pores.

Figure 11:
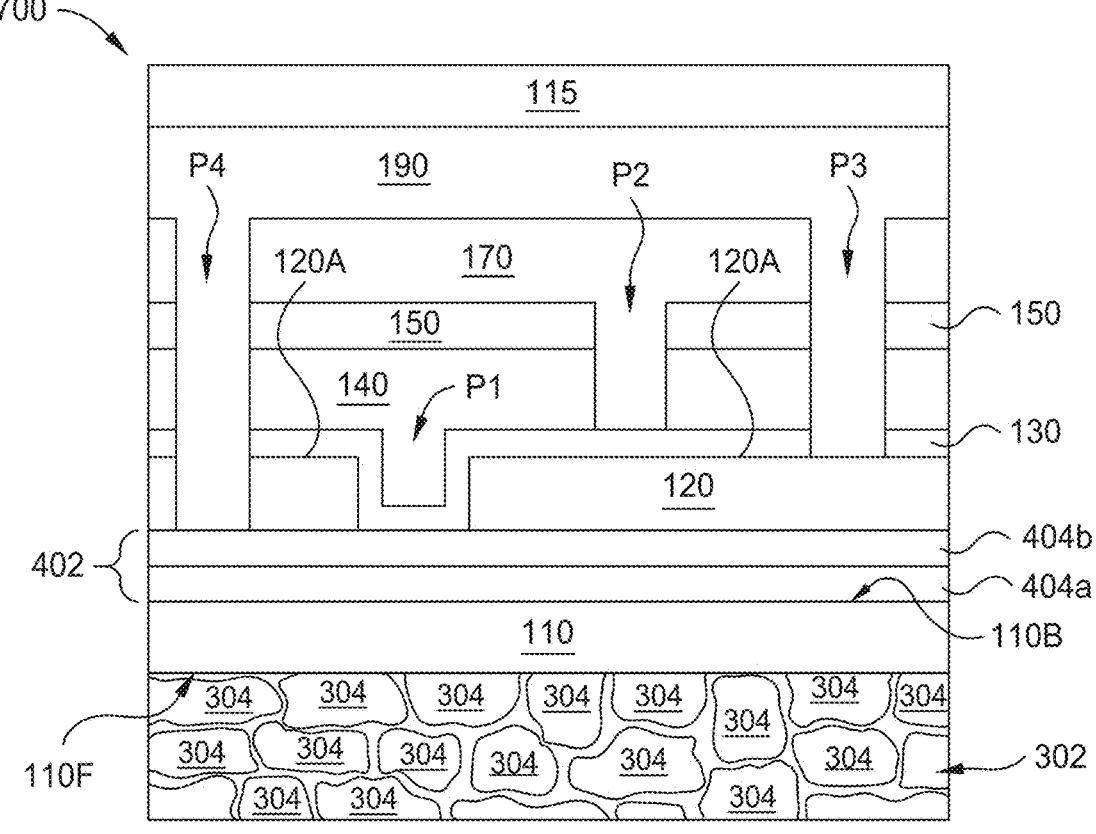
FIG. 11 illustrates a schematic side cross-sectional view the photovoltaic cell 700 according to one or more embodiments.

In another example, the UV blocking layer 202 may be the UV blocking layer 402 formed on the backside 110B of the first substrate 110 (FIG. 9). As noted above, the UV blocking layer 402 can advantageously serve at least two purposes: act as a diffusion barrier to ions in the first substrate 110 (e.g., sodium (Na)) and index matching to protect the device 100A, 100B from detrimental UV radiation. In some embodiments, the UV blocking layer 402, which can include a single layer of material or a plurality of sub-layers of material as discussed above, can be deposited by use of a physical vapor deposition (PVD) process, a chemical vapor deposition (CVD) process, plasma enhanced chemical vapor deposition (PECVD) process, an atomic layer deposition (ALD) process, a plasma enhanced atomic layer deposition (PEALD) process, a molecular beam epitaxy (MBE) process, evaporation process, or other useful deposition technique. In another example, a process of forming a photovoltaic device can include forming an UV blocking layer 202 on both sides of the first substrate 110. For example, the UV blocking layer 302 may be formed on the frontside 110F of first substrate 110 and the UV blocking layer 402 on the backside 110B of the first substrate 110 (FIG. 11).

As illustrated in FIG. 7C, at operation 605 of the method 600, the first contact layer 120 is formed on a first surface of the first substrate 110. The first contact layer 120 includes an electrical contact layer material. The first contact layer 120 can have a first contact thickness between about 5 nanometers (nm) to about 1000, such as about 20 nm. The first contact layer 120 may be formed by any suitable process including, but not limited to a physical vapor deposition (PVD) process (e.g., sputtering or evaporation processes), a chemical vapor deposition (CVD) process, plasma enhanced chemical vapor deposition (PECVD) process, an atomic layer deposition (ALD) process, a plasma enhanced atomic layer deposition (PEALD) process, or other suitable deposition technique. Furthermore, as noted above, the first contact layer 120 may be made formed from a ZnO material to further protect the photovoltaic cell 700 from UV damage. In some examples, the first contact layer 120 may be formed in addition to the UV blocking layer formed in operation 603. In other examples the first contact layer 120 being formed from a ZnO or an SnO$_2$ material is sufficient to protect the photovoltaic cell 700 from UV radiation (FIG. 11). Thus, in some examples, if the first contact layer is formed from a ZnO material, operation 603 may be optional.

At operation 610 of the method 600, as illustrated in FIG. 7D, the first contact layer 120 is patterned by performing a first scribing process in which the P1 scribe lines are formed in the first contact layer 120. The P1 scribe lines are formed so that each P1 scribe line extends through the first contact layer 120 and at least to the surface of the first substrate 110 to form electrically isolated regions 120A that are bounded by the P1 scribe lines and include portions of the first contact layer 120. As shown in FIG. 7D, the P1 scribe line divides the first contact layer 120 into two separate electrically isolated regions 120A. The P1 scribe line may be formed by any suitable process, including, but not limited to, mechanical scribing systems, laser ablation, or combination thereof.

Typically, the first scribe line is formed by using a laser to pattern the first contact layer 120. Stated otherwise laser pulses are directed towards a conductive oxide layer (i.e., the first contact layer 120) to ablate the first contact layer 120 material to form a patterned first contact layer 120 (e.g., patterned conductive oxide layer). Conventionally, without the addition of the UV blocking layer(s), energy from each laser pulse used to form a P1 scribe line will pass through the first substrate 110 and ablate the contact layer material or ablate the contact layer material and pass through the first substrate 110 depending on the side of the first substrate 110 the laser pulse is provided. However, due to the addition of the UV blocking layer(s) each laser pulse that is directed to ablate a portion of the contact layer material can be configured to pass through the contact layer material and then be reflected back through the conductive oxide layer due to the selected laser wavelength being in a range of wavelengths that is reflected from the formed UV blocking layer(s). In one example, a UV laser, such as a 285 nm, 355 nm, or any other suitable wavelength laser is used during operation 610, and the UV blocking layer material is configured to reflect wavelengths between about 310 nm to about 430 nm and nm 310-430 nm. In one example, the output of the laser is tuned relative to the optical properties of the UV blocking layer to cause at least 30-90%, such as at least 50-90%, or at least 80-90% of the energy of each laser pulse to be reflected back through the contact layer material. Thus, the addition of the UV blocking layer(s) during operation 610 will allow the use of a lower powered laser and fewer number of laser pulses to form the P1 scribe lines. The ability to use a lower powered laser is at least due to the longer path length through the contact layer material (e.g., twice the contact layer material thickness) that the laser pulse will experience which allows more of the energy provided in the laser pulse to be absorbed in the contact layer material to further improve the P1 scribe line laser ablation process. The ability to use a lower powered laser will reduce the capital cost of the laser required to perform operation 610. Use of lower energy pulses will also tend to improve the sharpness and critical dimension repeatability of the edges of the formed P1 scribe line due to the lower energy (e.g., less violent) ablation process. Moreover, forming the P1 scribe lines using less power and less time, will reduce the overall cost of forming the photovoltaic cell 700. Furthermore, using a lower powered results in less melting of the surface of the first contact layer 120 when being patterned which leads to sharper, more defined, and more consistent P1 scribe lines formed across the entire photovoltaic cell.

As illustrated in FIG. 7E, at operation 615 of the method 600, a first charge transport layer (CTL) 130 is formed over the patterned first contact layer 120. The first CTL 130 is disposed over the patterned portions of the first contact layer 120, the exposed sidewall surfaces of the P1 scribe lines, and the exposed portion of the first substrate 110. The first CTL 130 has a first CTL thickness between about 0.1 nm to about 10 μm, preferably between about 1 to 100 nm, more preferably between 10 to 70 nm. The first CTL 130 may be formed by any suitable process including, but not limited to a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., evaporation process), or other suitable deposition technique.

At operation 620 of method 600, as shown in FIG. 7F, an absorber layer 140 is formed over the first CTL 130. In some embodiments, the absorber layer 140 is disposed on the first CTL 130. The absorber layer 140 includes an absorber material, the absorber material may include, a perovskite material. The absorber layer 140 may be formed by any suitable solution based deposition process including, but not limited to printing, slot-die coating, spray-coating, gravure printing, or any combination thereof. The deposited absorber layer 140 has an absorber layer thickness between about 300 nm to about 1000 nm. For example, the absorber thickness is between about 450 nm to about 950 nm, preferably between about 500 nm to about 650 nm. In some embodiments, the absorber layer 140 may have an absorber thickness between about 1000 nm to about 2000 nm. In some embodiments, the absorber layer 140 fills, or at least partially fills the P1 scribe lines.

Figure 7G:
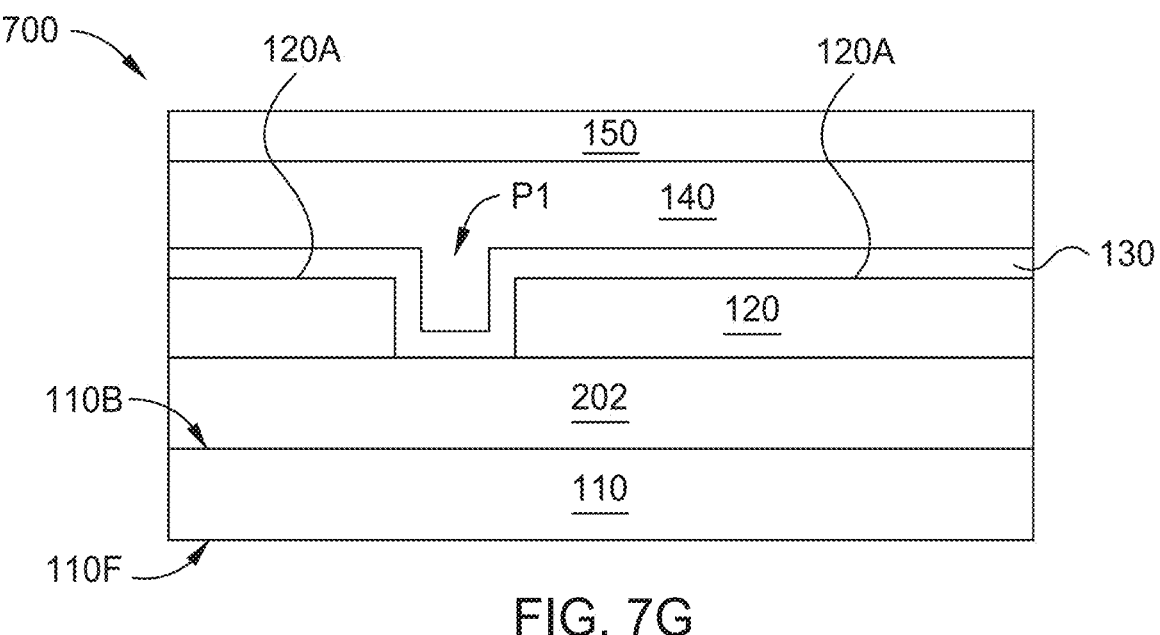
FIGS. 7A-7L illustrate schematic cross-sectional views of the photovoltaic cell during various stages of the fabrication of the photovoltaic device which relate to the operations found in method illustrated in FIG. 6.

At operation 625, as shown in FIG. 7G, a second charge transport layer (CTL) 150 is deposited over the absorber layer 140. As discussed above, in some embodiments, the second CTL 150, being configured to act as an ETL, may include a plurality of layers where each layer of the plurality of layers may include a different electron transport material. The second CTL 150 has a second CTL thickness between about 0.1 nm to about 1 μm. The second CTL 150 may be formed by any suitable process including, but not limited to vacuum evaporation, atomic layer deposition, sputtering, chemical vapor deposition, or combination thereof.

In other embodiments, the second charge transport layer (CTL) 150 may be deposited over a buffer layer 160 formed over the absorber layer 140. Thus, the buffer layer 160 may be disposed over the exposed portions of the absorber layer 140. In another example, the buffer layer 160 may be formed between the second CTL 150 and the second contact layer 170. Thus, the buffer layer 160 may be disposed over the exposed portions of the second CTL 150. In some embodiments, the buffer layer 160 has a thickness between about 0.1 nm to about 20 nm. The buffer layer 160 can comprise a material with a bandgap typically larger than the absorber layer 140 which may passivate the perovskite surface and/or slow the surface recombination rate, create a tunneling barrier, and/or otherwise change the interfacial properties between absorber layer 140 and the second CTL 150. The buffer layer 160 can comprise, but is not limited to, oxides, oxysalts, sulfates, organics, organic salts, and fluorides. The buffer layer 160 may be formed by any suitable process including, but not limited to a solution based deposition process, a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., evaporation process), or other suitable deposition technique. In one example, the deposited buffer layer 160 has a total thickness between about 0.4 nm to about 40 nm.

Figure 7H:
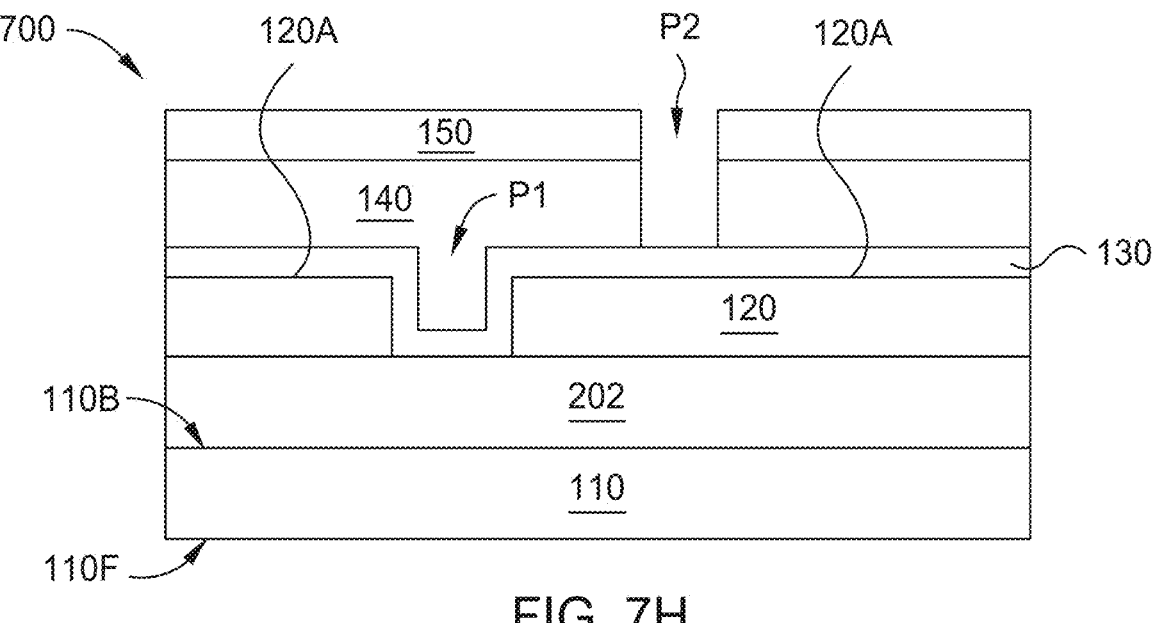
Figure 7:
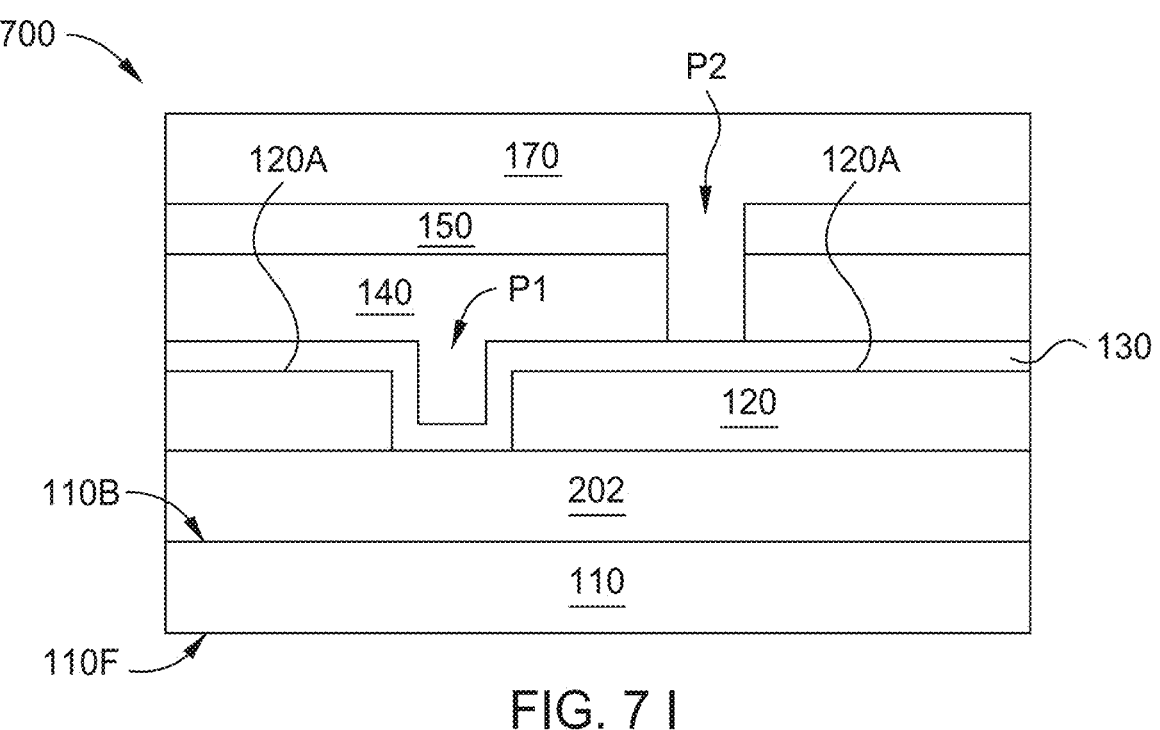

At operation 630, as shown in FIG. 7H, a plurality of second scribe lines P2 are formed (i.e., extend) through the first CTL 130, absorber layer 140, and the second CTL 150, and expose a portion of the first contact layer 120. In some embodiments, each of the formed second scribe lines P2 may extend into a portion of the first contact layer 120. The second scribe lines P2 each include a surface that contains portions of the second CTL 150, a portion of the absorber layer 140, a portion of the first CTL 130, and a portion of the first contact layer 120. The second scribe lines P2 may be formed by any suitable process, including, but not limited to, mechanical scribing systems, laser ablation, or combination thereof. The second scribe lines P2 are positioned on a first side (e.g., right side in FIG. 7H) of the P1 scribe lines.

At operation 635, as shown in FIG. 7I, the second contact layer 170 is formed over the second CTL 150, absorber layer 140, first CTL 130, the first contact layer 120 and the first substrate 110. The second contact layer 170 is disposed over the second CTL 150 and fills at least a significant portion or all of the second scribe line P2. The second contact layer 170 may be formed from any suitable contact layer material as described above. In one example, the second contact layer 170 includes an IZO or ITO layer. The second contact layer 170 has a first thickness of between about 5 nm to about 1000 nm. The second contact layer 170 may be formed by any suitable process including, but not limited to a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process, printing, spraying or other suitable deposition technique.

Figure 7J:
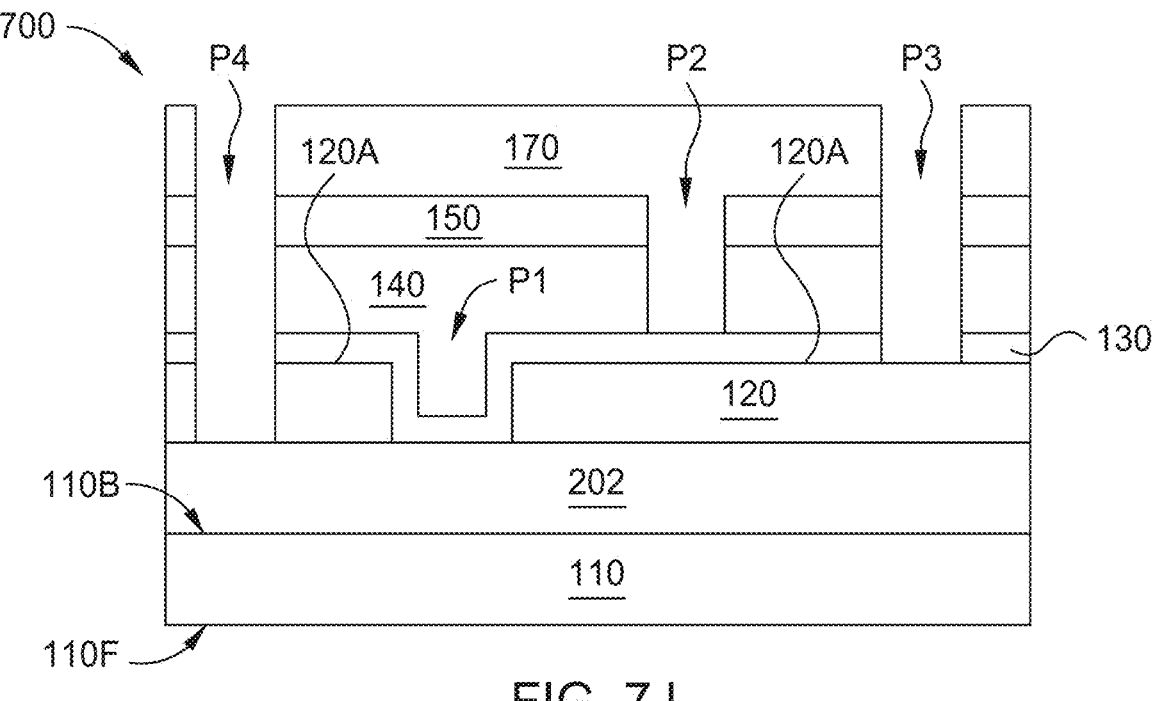

At operation 640, as shown in FIG. 7J a plurality of third scribe lines P3 and a plurality of fourth scribe lines P4 are formed through portions of the photovoltaic device stack. Each of the third scribe lines P3 extends through the second contact layer 170, the second CTL 150, and at least a significant portion of the absorber layer 140. In some embodiments, as shown in FIG. 7G, the third scribe lines P3 extends through the second contact layer 170, the second CTL 150, the absorber layer 140, and the first CTL 130, and expose a portion of the first contact layer 120. In some embodiments, the third scribe line P3 may extend into a portion of the first contact layer 120. The third scribe lines P3 each include a surface that contains portions of the second contact layer 170, the second CTL 150, the buffer layer 160, the absorber layer 140, the first CTL 130, and the first contact layer 120. The third scribe lines P3 may be formed by any suitable process, including, but not limited to, mechanical scribing systems, laser ablation, or combination thereof. In some examples of the present disclosure, the third scribe lines P3 and the fourth scribe lines P4 may each have a width between 5 μm and 200 μm. The third scribe lines P3 are positioned on the first side (e.g., right side in FIG. 7J) of the P1 scribe lines and the second scribe line P2.

During operation 640, the plurality of fourth scribe lines P4 are formed through the device layer stack. The fourth scribe lines P4, extend through the second contact layer 170, the second CTL 150, the absorber layer 140, the first CTL 130, and the first contact layer 120 and generally to the top surface of the first substrate 110. In some embodiments, the fourth scribe line P4 may extend into the first substrate 110. The fourth scribe lines P4 are separate from the third scribe lines P3 and are used to isolate the photovoltaic device array 1401 from the unusable edge portions of the photovoltaic device 300 formed at the edge of the first substrate 110 of the photovoltaic device 300. In some embodiments the fourth scribe lines P4 may be wide enough to extend to the edge of the photovoltaic device 300. The fourth scribe lines P4 each include a surface that contains portions of the second contact layer 170, the second CTL 150, buffer layer 160, the absorber layer 140, the first CTL 130, the first contact layer 120, and the first substrate 110. The fourth scribe lines P4 may be formed by any suitable process, including, but not limited to, mechanical scribing systems, laser ablation, or combination thereof.

Figure 7K:
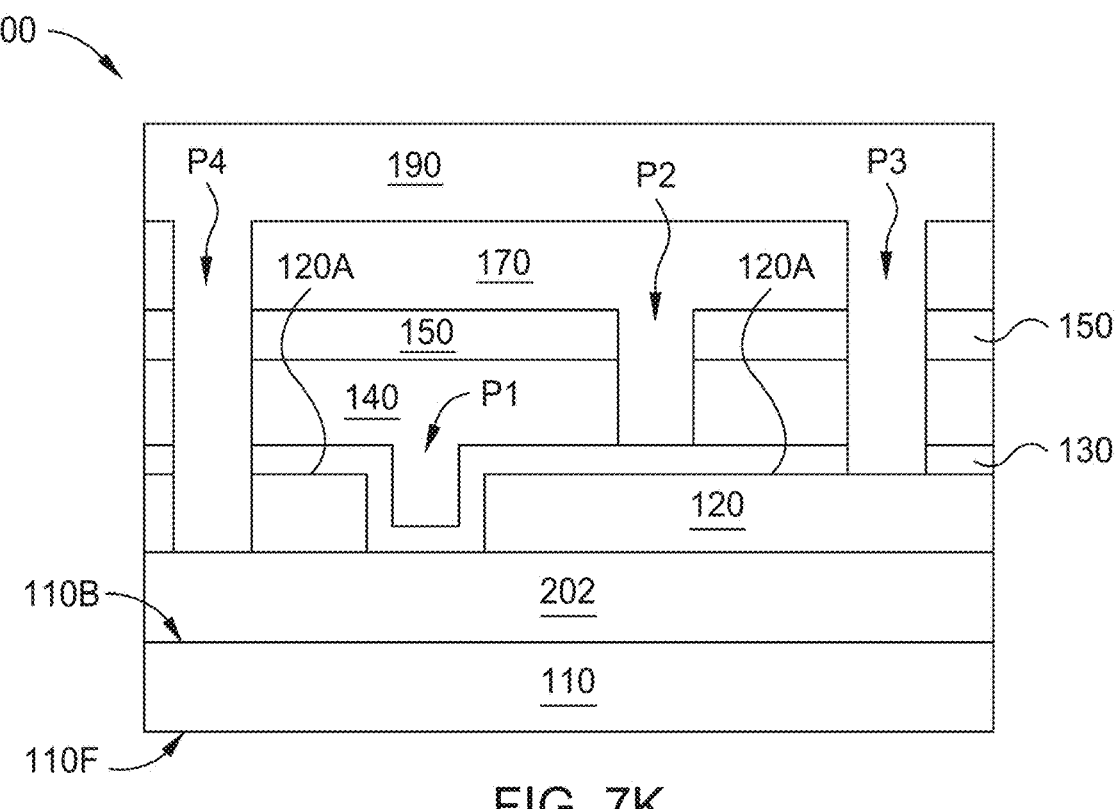

At operation 645, as shown in FIG. 7K, an encapsulation layer 190 is disposed and/or formed over the device layer stack. As shown in FIG. 7G, the encapsulation layer 190 is disposed over the second contact layer 170 and fills the voids created by the third scribe lines P3 and the fourth scribe lines P4. The encapsulation layer 190 includes an encapsulation material. The encapsulation material may include, but is not limited to, ethylene vinyl acetate (EVA), polyolefin, polyurethane, polyvinyl butyral, ionomers or combination thereof. The encapsulation layer 190 has an encapsulation thickness between about 0.1 mm to about 5 mm. The encapsulation layer 190 may be formed by any suitable process including, but not limited to, a lamination process, casting, an autoclave process, or other common deposition and/or attachment techniques.

In some embodiments, prior to operation 645 one or more barrier layers may be formed over the device stack. For example, the one or more barrier layers (e.g., one or more barrier layers 180) may be deposited over the second contact layer 170 and the exposed surfaces of the third scribe lines P3 and the fourth scribe lines P4, and partially fill the openings formed by the third scribe lines P3 and the fourth scribe lines P4. The encapsulation layer 190 may be formed over the one or more barrier layers.

The one or more barrier layers include a barrier material. Each barrier layer of the one or more barrier layers may include a different barrier material. The barrier materials of the one or more barrier layers may include a metal oxide. In one example, the one or more barrier layers include, but are not limited to, a material that comprises aluminum oxide, silicon oxide, tin oxide, titanium oxide, zirconium oxide, or combination thereof. The barrier materials of the one or more barrier layers may include a styrenic polymer, a polysiloxane, an amine-containing polymer, a polyacrylate, an aryl ammonium halide, an alkyl ammonium halide, a fluorinated hydrocarbon polymer, or a combination thereof. In another example, the one or more barrier layers include, but are not limited to, a styrenic polymer such as polystyrene (PS), acrylonitrile butadiene styrene (ABS), acrylonitrile-styrene-acrylate (ASA) or styrene-butadiene rubber (SBR). In another example, the one or more barrier layers include, but are not limited to, a polysiloxane such as poly(dimethylsiloxane), poly(diethylsiloxane) or poly(methylphenylsiloxane). In another example, the one or more barrier layers include, but are not limited to, a amine-containing polymer such as polyethylenimine (PEIE), poly(vinylamine) hydrochloride (PVH), or poly(ethylene glycol) bis(amine) (PEG-Amine). In another example, the one or more barrier layers include, but are not limited to, a polyacrylate such as polymethylmethacrylate (PMMA) or polyethylacrylate. In another example, the one or more barrier layers include, but are not limited to, an aryl ammonium halide such as phenethylammonium iodide (PEAI), 1-(ammonium acetyl) pyrene (PEY) or dodecyl ammonium-chloride (DACI). In another example, the one or more barrier layers include, but are not limited to, an alkyl ammonium halide such as n-propylammonium iodide (PAI), ethane-1,2-diammonium (EDA), 2-chloroethylamine (CEA) or 2-bromo-ethylamine (BEA). In another example, the one or more barrier layers include, but are not limited to, a fluorinated hydrocarbon polymer such as Nafion™, polytetrafluoroethylene, polyvinylidene-fluoride, or trifluoroethylene. The one or more barrier layers have a barrier thickness between about 1 nm to about 5 μm. The one or more barrier layers 180 may be conformally deposited by any suitable process, for example, a chemical vapor deposition (CVD) process, plasma enhanced chemical vapor deposition (PECVD) process, an atomic layer deposition (ALD) process, a plasma enhanced atomic layer deposition (PEALD) process, a physical vapor deposition (PVD) process (e.g., thermal evaporation), or solution processing methods such ink-jet printing, slot-die coating, spray-coating, gravure printing, blanket coating. In some embodiments, the solution processing methods include an annealing process.

Figure 7L:
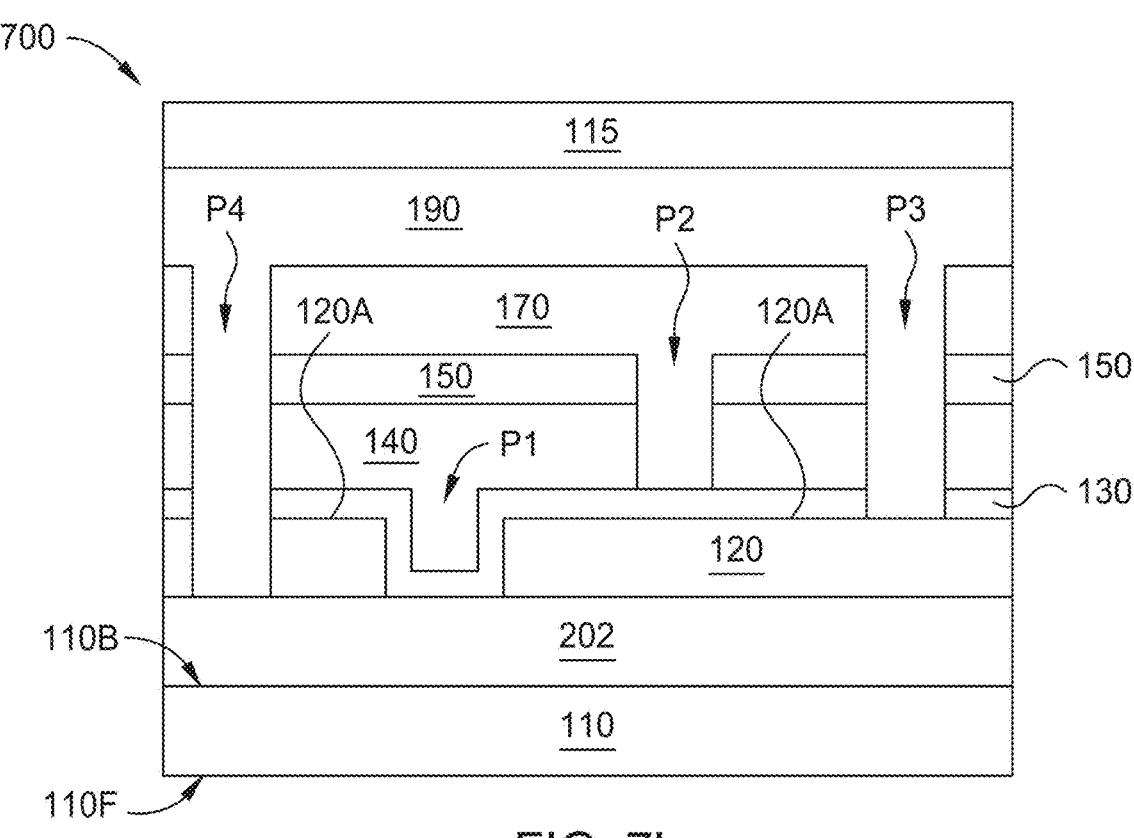

At operation 650, as shown in FIG. 7L, a second substrate layer 115 is disposed on and/or coupled to the encapsulation layer 190. The second substrate layer 115 has a second substrate thickness between about 0.05 mm to about 5 mm. In some embodiments, as discussed above, second substrate layer 115 can include one or more materials selected from a group that includes a metal foil, silicon, glass, and/or a polymer substrate. In some embodiments, as discussed above, second substrate layer 115 is glass with a thickness between about 1 mm and 3 mm.

Alternative Photovoltaic Device Examples

FIG. 8 illustrates a schematic side cross-sectional view the photovoltaic cell 700 according to one or more embodiments. As illustrated in FIG. 8, the UV blocking layer 302 may be formed on the backside 110B of the first substrate 110. Although the P1 scribe line is illustrated as only extending through the first contact layer 120, the P1 scribe line may extend a portion, or the entire UV blocking layer 302.

FIG. 9 illustrates a schematic side cross-sectional view the photovoltaic cell 700 according to one or more embodiments. As illustrated in FIG. 9 the UV blocking layer may include the UV blocking layer 402 formed on a backside 110B of the first substrate 110. Although the P1 scribe line is illustrated as only extending through the first contact layer 120, the P1 scribe line may extend a portion, or the entire UV blocking layer 402.

FIG. 10 illustrates a schematic side cross-sectional view the photovoltaic cell 700 according to one or more embodiments. As illustrated in FIG. 10, the UV blocking layer 302 may be formed on the frontside 110F of the first substrate 110.

FIG. 11 illustrates a schematic side cross-sectional view the photovoltaic cell 700 according to one or more embodiments. As illustrated in FIG. 11, the UV blocking layer 302 may be formed on the frontside 110F of the first substrate 110 and the UV blocking layer 402 may be formed on the backside 110B of the first substrate 110. Although the P1 scribe line is illustrated as only extending through the first contact layer 120, the P1 scribe line may extend through a portion, or the entire UV blocking layer 402.

Figure 12:
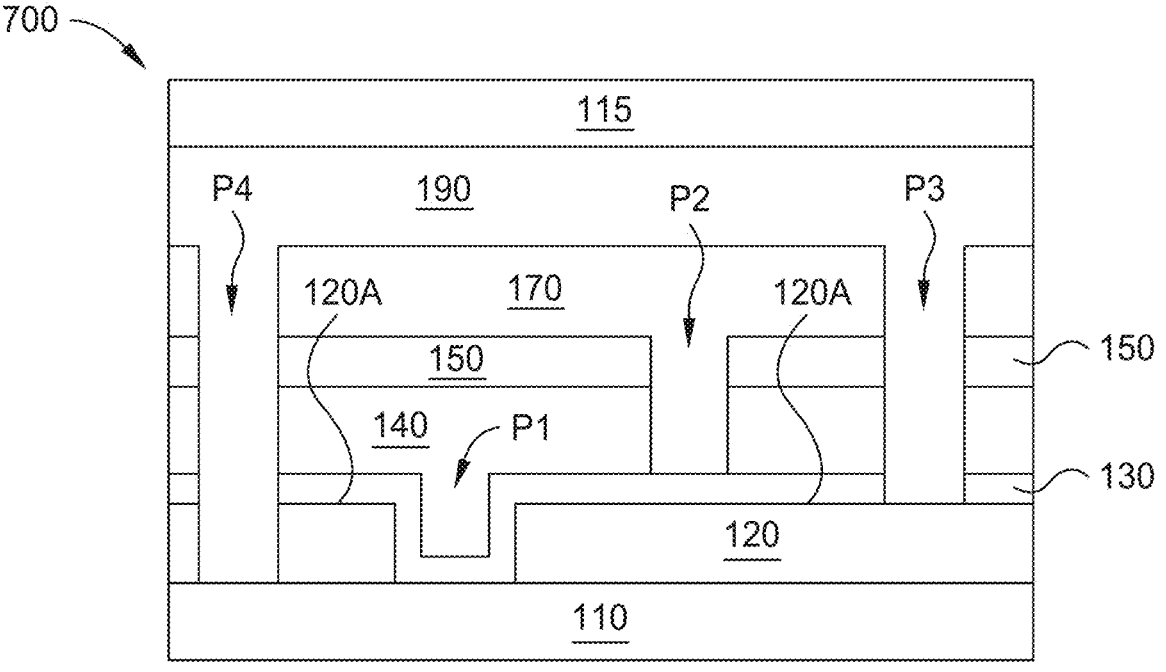
FIG. 12 illustrates a schematic side cross-sectional view the photovoltaic cell 700 according to one or more embodiments.

FIG. 12 illustrates a schematic side cross-sectional view the photovoltaic cell 700 according to one or more embodiments. As illustrated in FIG. 12, the first contact layer 120 comprises a ZnO material that can provide UV protection to the photovoltaic cell 700.

While the foregoing is directed to embodiments of the present invention, other and further embodiments of the invention may be devised without departing from the basic scope thereof, and the scope thereof is determined by the claims that follow.

What is claimed is:

1. A photovoltaic device comprising:
a plurality of photovoltaic cells coupled in series, the photovoltaic cells comprising:
a first contact layer disposed over a first substrate;
a first charge transport layer (CTL) disposed over the first contact layer;
an absorber layer disposed over the first CTL;
a second CTL disposed over the absorber layer; and
an ultraviolet (UV) blocking layer disposed between the first substrate and the first contact layer, wherein the UV blocking layer comprises a first layer formed on a first side of the first substrate and a second layer formed over the first layer,
a first refractive index difference between the first layer and the first substrate is less than or equal to 1.3, and
a second refractive index difference between the second layer and the first layer is from about 0.75 and about 1.5.

2. The photovoltaic device of claim 1, further comprising a second UV blocking layer formed on a second side of the first substrate, wherein the second side is on an opposite side of the first substrate from the first side.

3. The photovoltaic device of claim 2, wherein the second UV blocking layer comprises a porous material comprising nanoparticles comprising a conductive oxide material.

4. The photovoltaic device of claim 3, wherein the nanoparticles comprise at least one of zinc oxide (ZnO), cerium dioxide ($CeO_2$), and titanium dioxide ($TiO_2$).

5. The photovoltaic device of claim 1, wherein the first layer comprises silicon dioxide ($SiO_2$), and the second layer comprises at least one of: tin oxide ($SnO_2$), titanium dioxide ($TiO_2$), or niobium pentoxide ($Nb_2O_5$).

6. The photovoltaic device of claim 1, wherein the first contact layer comprises zinc oxide (ZnO).

7. The photovoltaic device of claim 1, further comprising:
a second contact layer formed over the second CTL;
an encapsulation layer formed over the second contact layer; and
a second substrate formed over the encapsulation layer.

8. A photovoltaic device comprising:

a plurality of photovoltaic cells coupled in series, the photovoltaic cells comprising:

a first contact layer disposed over a first substrate;

a first charge transport layer (CTL) disposed over the first contact layer;

an absorber layer disposed over the first CTL, wherein the absorber layer comprises a perovskite material that has a stoichiometry of $ABX_3$, where A is a first cation, B is a second cation, and X comprises at least one halide;

a second CTL disposed over the absorber layer; and a first ultraviolet (UV) blocking layer disposed between the first substrate and the first contact layer, wherein the first ultraviolet (UV) blocking layer comprises a first layer formed on a first side of the first substrate and a second layer formed over the first layer.

9. The photovoltaic device of claim 8, further comprising a second UV blocking layer formed on a front side of the first substrate.

10. The photovoltaic device of claim 9, wherein the second UV blocking layer comprises a porous material formed from nanoparticles comprising a metal oxide material.

11. The photovoltaic device of claim 10, wherein nanoparticles comprise at least one of zinc oxide (ZnO), cerium dioxide ($CeO_2$), and titanium dioxide ($TiO_2$).

12. The photovoltaic device of claim 8, wherein the first contact layer comprises zinc oxide (ZnO).

13. The photovoltaic device of claim 8, wherein the first layer comprises silicon dioxide ($SiO_2$), and the second layer comprises at least one of: tin oxide ($SnO_2$), titanium dioxide ($TiO_2$), or niobium pentoxide ($Nb_2O_5$).

14. The photovoltaic device of claim 8, wherein a first refractive index difference between the first layer and the first substrate is less than or equal to 1.3, and a second refractive index difference between the second layer and the first layer is from about 0.75 and about 1.5.

\* \* \* \* \*